US012722410B2

(12) United States Patent
Shimohara et al.

(10) Patent No.: US 12,722,410 B2
(45) Date of Patent: Sep. 1, 2026

(54) MANUFACTURING METHOD OF CONDUCTOR, MANUFACTURING METHOD OF ELECTROMAGNETIC WAVE SHIELDING BODY, AND CONDUCTOR

(71) Applicant: FUJIFILM Corporation, Tokyo (JP)

(72) Inventors: Norihide Shimohara, Kanagawa (JP); Yusuke Fujii, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 8 days.

(21) Appl. No.: 18/826,185

(22) Filed: Sep. 6, 2024

(65) Prior Publication Data

US 2024/0424817 A1 Dec. 26, 2024

Related U.S. Application Data

(63) Continuation of application No. PCT/JP2023/010050, filed on Mar. 15, 2023.

(30) Foreign Application Priority Data

Mar. 28, 2022 (JP) ................................ 2022-051172

(51) Int. Cl.

| | |
|---|---|
| ***B41M 3/00*** | (2006.01) |
| ***B41M 5/00*** | (2006.01) |
| ***B41M 7/00*** | (2006.01) |
| ***C09D 11/037*** | (2014.01) |
| ***C09D 11/52*** | (2014.01) |
| ***H05K 9/00*** | (2006.01) |

(52) U.S. Cl.

CPC .......... *B41M 3/008* (2013.01); *B41M 5/0047* (2013.01); *B41M 7/0081* (2013.01); *B41M 7/009* (2013.01); *C09D 11/037* (2013.01); *C09D 11/52* (2013.01); *H05K 9/0088* (2013.01)

(58) Field of Classification Search

CPC .. H05K 1/0219; H05K 9/0031; H05K 9/0073; H05K 2201/0707; H05K 9/0092; B41M 7/009; B41M 3/008; C09D 11/52; B32B 33/00

USPC ........................................................ 427/96.3

See application file for complete search history.

(56) References Cited

U.S. PATENT DOCUMENTS

| | | | | |
|---|---|---|---|---|
| 2011/0094784 A1* | 4/2011 | Muro | .................. | H05K 1/0218 174/250 |
| 2013/0206315 A1 | 8/2013 | Chung et al. | | |

FOREIGN PATENT DOCUMENTS

| | | |
|---|---|---|
| JP | 2006176681 | 7/2006 |
| JP | 2007311646 | 11/2007 |
| JP | 2011249245 | 12/2011 |
| JP | 2012018763 | 1/2012 |
| JP | 2012022833 | 2/2012 |
| JP | 2013538439 | 10/2013 |
| JP | 2015-126230 | * 7/2015 |
| JP | 2015147373 | 8/2015 |

OTHER PUBLICATIONS

"International Search Report (Form PCT/JP2023/010050," mailed on May 23, 2023, with English translation thereof, pp. 1-7.

"Written Opinion of the International Searching Authority (Form PCT/ISA/237) of PCT/JP2023/010050," mailed on May 23, 2023, with English translation thereof, pp. 1-6.

* cited by examiner

*Primary Examiner* — Tabassom Tadayyon Eslami
(74) *Attorney, Agent, or Firm* — JCIPRNET

(57) ABSTRACT

An object of the present invention is to provide a manufacturing method of a conductor capable of forming a conductive film having excellent rub resistance. Another object of the present invention is to provide a manufacturing method of an electromagnetic wave shielding body, and a conductor. The manufacturing method of a conductor of the present invention includes an ink preparation step of preparing a first ink containing at least a metal salt or a metal complex and a second ink containing at least a metal salt or a metal complex, a step 1 of forming a first coating film on a substrate using the first ink, and subjecting the first coating film to at least one first curing treatment selected from the group consisting of a heating treatment and a light irradiating treatment to form a first conductive film, and a step 2 of forming a second coating film on the first conductive film using the second ink, and subjecting the second coating film to at least one second curing treatment selected from the group consisting of a heating treatment and a light irradiating treatment to form a second conductive film, in which thicknesses of the first coating film and the second coating film and treatment conditions of the first curing treatment and the second curing treatment satisfy predetermined relational expressions.

10 Claims, No Drawings

MANUFACTURING METHOD OF CONDUCTOR, MANUFACTURING METHOD OF ELECTROMAGNETIC WAVE SHIELDING BODY, AND CONDUCTOR

CROSS-REFERENCE TO RELATED APPLICATIONS

This application is a Continuation of PCT International Application No. PCT/JP2023/010050 filed on Mar. 15, 2023, which claims priority under 35 U.S.C. § 119 (a) to Japanese Patent Application No. 2022-051172 filed on Mar. 28, 2022. The above applications are hereby expressly incorporated by reference, in their entirety, into the present application.

BACKGROUND OF THE INVENTION

1. Field of the Invention

The present invention relates to a manufacturing method of a conductor, a manufacturing method of an electromagnetic wave shielding body, and a conductor.

2. Description of the Related Art

A semiconductor device or the like may be interfered with by an electromagnetic wave, and normal operation may be hindered, which may result in malfunction. In addition, in a case where the semiconductor device or the like generates an electromagnetic wave, there is also a possibility that the electromagnetic wave may interfere with other semiconductor devices or electronic components, and thus normal operation may be hindered.

Therefore, in order to avoid the interference due to the electromagnetic wave from other electronic apparatuses or to avoid the interference with other electronic apparatuses by the electromagnetic wave, it is required to shield the electromagnetic wave. As a technique for shielding the electromagnetic wave, a technique of covering the semiconductor device or the like, which is a shielding target, with a shield can has been known. However, the shield can has problems such as a thick film thickness, a heavy weight, and a small degree of freedom in design, and a technique which replaces the shield can is required. For example, a technique of laminating an insulating film and an electromagnetic wave shielding layer on a printed wiring board in which a semiconductor device has been mounted to form an electromagnetic wave shielding body is known.

For example, JP2015-126230A discloses a technique related to a manufacturing method of an electromagnetic wave shielding film, the manufacturing method including an insulating film forming step of forming an insulating film on a first peeling film, and a metal pattern forming step of printing a metal pattern on the insulating film.

SUMMARY OF THE INVENTION

The present inventors have found that, with reference to the technique disclosed in JP2015-126230A, in a case where a conductive film is repeatedly formed to produce a laminate of conductive films in order to increase a thickness of the conductive films, the obtained laminate of conductive films has insufficient rub resistance on a surface thereof, and there is room for improvement.

In view of the above-described circumstances, an object of the present invention is to provide a manufacturing method of a conductor capable of forming a conductive film having excellent rub resistance. Another object of the present invention is to provide a manufacturing method of an electromagnetic wave shielding body, and a conductor.

As a result of intensive studies on the above-described object, the present inventors have found that the above-described object can be achieved by the following configurations.

[1] A manufacturing method of a conductor, comprising:

an ink preparation step of preparing a first ink containing at least a metal salt or a metal complex and a second ink containing at least a metal salt or a metal complex;

a step 1 of forming a first coating film on a substrate using the first ink, and subjecting the first coating film to at least one first curing treatment selected from the group consisting of a heating treatment and a light irradiating treatment to form a first conductive film; and a step 2 of forming a second coating film on the first conductive film using the second ink, and subjecting the second coating film to at least one second curing treatment selected from the group consisting of a heating treatment and a light irradiating treatment to form a second conductive film, in which at least one of Expression (1) described later or Expression (2) described later is satisfied.

[2] The manufacturing method of a conductor according to [1], in which the first ink and the second ink are the same as each other.

[3] The manufacturing method of a conductor according to [1] or [2], in which the heating treatment is performed as the first curing treatment in the step 1, and the heating treatment is performed as the second curing treatment in the step 2.

[4] The manufacturing method of a conductor according to [1] or [2], in which the light irradiating treatment is performed as the first curing treatment in the step 1, and the light irradiating treatment is performed as the second curing treatment in the step 2.

[5] The manufacturing method of a conductor according to [1] or [2], in which both the heating treatment and the light irradiating treatment are performed as the first curing treatment in the step 1, and both the heating treatment and the light irradiating treatment are performed as the second curing treatment in the step 2.

[6] The manufacturing method of a conductor according to any one of [1] to [5], in which the thickness of the second coating film formed in the step 2 is smaller than the thickness of the first coating film formed in the step 1.

[7] The manufacturing method of a conductor according to any one of [1] to [6], further comprising:

a step 3 of forming an insulating film on the substrate to produce a substrate with an insulating film, in which the step 1 is a step of forming the first conductive film on the insulating film of the substrate with an insulating film, which is produced in the step 3.

[8] A manufacturing method of an electromagnetic wave shielding body, comprising:

a step of forming a conductive film on a substrate according to the manufacturing method of a conductor according to any one of [1] to [7].

[9] The manufacturing method of an electromagnetic wave shielding body according to [8], in which the substrate is an electronic board in which an electronic component is mounted.

[10] A conductor manufactured by the manufacturing method of a conductor according to [1] to [7].

According to the present invention, it is possible to provide a manufacturing method of a conductor capable of forming a conductive film having excellent rub resistance. In addition, according to the present invention, it is possible to provide a manufacturing method of an electromagnetic wave shielding body, and a conductor.

DESCRIPTION OF THE PREFERRED EMBODIMENTS

Hereinafter, the present invention will be described in detail.

The following description is made based on representative embodiments of the present invention, and the present invention is not limited to such embodiments.

In the present specification, numerical ranges represented by "to" include numerical values before and after "to" as lower limit values and upper limit values. In a numerical range described in a stepwise manner in the present specification, an upper limit value or a lower limit value described in a certain numerical range may be replaced with an upper limit value or a lower limit value in another numerical range described in a stepwise manner. In addition, in the numerical range described in the present specification, an upper limit value and a lower limit value described in a certain numerical range may be replaced with values shown in Examples.

In the present specification, for each component, one kind of substance corresponding to each component may be used alone, or two or more kinds thereof may be used in combination. Here, in a case where two or more kinds of substances are used in combination for each component, the content of the component indicates the total content of two or more substances, unless otherwise specified.

In the present specification, a combination of two or more preferred aspects is a more preferred aspect.

In the present specification, the meaning of the term "step" includes not only an independent step but also a step whose intended purpose is achieved even in a case where the step is not clearly distinguished from other steps.

In the present specification, "g" represents "mass g".

In the present specification, "pL" represents "picoliter". 1 pL is equal to $10^{-12}$ L.

In the present specification, unless specified otherwise, an angle represented by a specific numerical value and the description regarding an angle such as "parallel", "perpendicular", or "orthogonal" includes an error range that is generally allowable in the corresponding technical field.

In the present specification, "conductive" means a property of having a volume resistivity of less than 108 Ωcm.

[Manufacturing Method of Conductor]

The manufacturing method of a conductor according to the embodiment of the present invention (hereinafter, also referred to as "present manufacturing method") includes an ink preparation step of preparing a first ink containing at least a metal salt or a metal complex and a second ink containing at least a metal salt or a metal complex; a step 1 of forming a first coating film on a substrate using the first ink, and subjecting the first coating film to at least one first curing treatment selected from the group consisting of a heating treatment and a light irradiating treatment to form a first conductive film; and a step 2 of forming a second coating film on the first conductive film using the second ink, and subjecting the second coating film to at least one second curing treatment selected from the group consisting of a heating treatment and a light irradiating treatment to form a second conductive film.

In the present manufacturing method, at least one of Expression (1) or Expression (2) is satisfied.

$$1.2 \leq \{(T2-23)\times t2/L2\}/\{(T1-23)\times t1/L1\} \quad \text{Expression (1)}$$

$$2.0 \leq (E2/L2)/(E1/L1) \quad \text{Expression (2)}$$

In the expressions, L1 and L2 each represent a thickness (μm) of the first coating film or the second coating film, T1 and T2 each represent a heating temperature (° C.) of the heating treatment to be performed as the first curing treatment or the second curing treatment, t1 and t2 each represent a heating time (min) of the heating treatment to be performed as the first curing treatment or the second curing treatment, and E1 and E2 each represent an exposure amount (J/cm$^2$) of the light irradiating treatment performed as the first curing treatment or the second curing treatment.

That is, in a case where the present manufacturing method satisfies Expression (1), the heating treatment is performed as the first curing treatment of the step 1, and the heating treatment is performed as the second curing treatment of the step 2. In addition, in a case where the present manufacturing method satisfies Expression (2), the light irradiating treatment is performed as the first curing treatment of the step 1, and the light irradiating treatment is performed as the second curing treatment of the step 2.

According to the present manufacturing method, it is possible to produce a conductor having, on a surface, a conductive film excellent in rub resistance. A reason for this is not clear in detail, but is presumed to be as follows by the present inventors.

In the present manufacturing method, since the ink containing a metal salt or a metal complex is used, it is presumed that metal components in the first conductive film and the second conductive film to be formed are difficult to be granulated, and a conductive film having high continuity is formed, and as a result, the rub resistance is improved. In addition, in a case where at least one of Expression (1) or Expression (2) is satisfied, it is presumed that, in the second curing treatment, since more energy is applied to the coating film of the conductive ink per unit film thickness, as compared with the first curing treatment, a reduction reaction of the metal salt or the metal complex, contained in the coating film, is promoted, and thus a conductive film having higher continuity and excellent rub resistance is formed on the surface side.

Hereinafter, each step included in the present manufacturing method will be described in detail.

[Ink Preparation Step]

The ink preparation step is a step of preparing the first ink and the second ink.

Both the first ink and the second ink (hereinafter, also collectively referred to as "conductive ink") contain at least a metal salt or a metal complex.

The conductive ink is, for example, an ink composition obtained by dissolving, in a solvent, at least one selected from the group consisting of a metal salt and a metal complex, and is used for forming a film having conductivity (that is, a conductive film).

The "preparation" in the ink preparation step means not only an act of preparing the conductive ink by synthesizing and/or mixing constitutional components of the conductive ink containing a metal salt or a metal complex, but also an act of procuring the conductive ink containing a metal salt or a metal complex by purchasing or the like.

The first ink and the second ink may be the same as or different from each other, but it is preferable that the first ink and the second ink are the same as each other. The fact that the two inks are the same as each other means that the inks contain the same type of components with the same content. The fact that the two inks are different from each other means that at least the type of components contained in the inks or the content thereof varies between the inks.

The first ink and the second ink can also be prepared by preparing a conductive ink containing a metal salt or a metal complex, and then dividing the prepared conductive ink. In addition, the first ink and the second ink may be prepared separately.

<Conductive Ink>

Hereinafter, the conductive ink will be described.

The conductive ink contains at least a metal salt or a metal complex.

Examples of a metal constituting the metal salt or the metal complex include silver, copper, gold, aluminum, magnesium, tungsten, molybdenum, zinc, nickel, iron, platinum, tin, copper, and lead. Among these, from the viewpoint that the conductivity is more excellent, the metal constituting the metal salt or the metal complex preferably includes at least one selected from the group consisting of silver, gold, platinum, nickel, palladium, or copper; more preferably includes at least one of silver or copper; and still more preferably includes silver. A content of the metal contained in the conductive ink in terms of metal element is preferably 1% to 40% by mass, more preferably 5% to 30% by mass, and still more preferably 7% to 20% by mass with respect to the total mass of the conductive ink.

Each content of the metal salt and the metal complex (total content in a case of containing both the metal salt and the metal complex) contained in the conductive ink is preferably 10% to 90% by mass and more preferably 10% to 40% by mass with respect to the total mass of the conductive ink. In a case where the above-described content is 10% by mass or more, a surface resistivity is further reduced. In a case where the above-described content is 90% by mass or less, jetting stability is further improved in a case where the conductive ink is jetted from a nozzle by a spray method or an ink jet recording method.

Hereinafter, the metal salt and the metal complex contained in the conductive ink will be described.

(Metal Salt)

Examples of the metal salt contained in the conductive ink include a benzoate, a halide, a carbonate, a citrate, an iodate, a nitrite, a nitrate, an acetate, a phosphate, a sulfate, a sulfide, a trifluoroacetate, or a carboxylate of the metal. Two or more kinds of salts may be combined.

Examples of the metal salt include a benzoate, a halide, a carbonate, a citrate, an iodate, a nitrite, a nitrate, an acetate, a phosphate, a sulfate, a sulfide, a trifluoroacetate, or a carboxylate of a metal. Two or more kinds of salts may be combined.

From the viewpoint of conductivity and storage stability, the metal salt is preferably a metal carboxylate. A carboxylic acid forming the metal carboxylate is preferably at least one selected from the group consisting of formic acid and a carboxylic acid having 1 to 30 carbon atoms; more preferably a carboxylic acid having 8 to 20 carbon atoms; and still more preferably a fatty acid having 8 to 20 carbon atoms. The fatty acid may be linear or branched, or may have a substituent.

Examples of the linear fatty acid include acetic acid, propionic acid, butyric acid, valeric acid, pentanoic acid, hexanoic acid, heptanoic acid, behenic acid, oleic acid, octanoic acid, nonanoic acid, decanoic acid, caproic acid, enanthic acid, caprylic acid, pelargonic acid, capric acid, and undecanoic acid.

Examples of the branched fatty acid include isobutyric acid, isovaleric acid, ethylhexanoic acid, neodecanoic acid, pivalic acid, 2-methylpentanoic acid, 3-methylpentanoic acid, 4-methylpentanoic acid, 2,2-dimethylbutanoic acid, 2,3-dimethylbutanoic acid, 3,3-dimethylbutanoic acid, and 2-ethylbutanoic acid.

Examples of a carboxylic acid having a substituent include hexafluoroacetylacetonate, hydroangelate, 3-hydroxybutyric acid, 2-methyl-3-hydroxybutyric acid, 3-methoxybutyric acid, acetonedicarboxylic acid, 3-hydroxyglutaric acid, 2-methyl-3-hydroxyglutaric acid, and 2,2,4,4-hydroxyglutaric acid.

The metal salt may be a commercially available product, or may be manufactured by a known method. A silver salt is produced, for example, by the following method.

First, a silver compound (for example, silver acetate) functioning as a silver supply source and formic acid or a fatty acid having 1 to 30 carbon atoms in the same quantity as the molar equivalent of the silver compound are added to an organic solvent such as ethanol. The mixture is stirred for a predetermined time using an ultrasonic stirrer, and the formed precipitate is washed with ethanol and decanted. All of these steps can be performed at room temperature. A mixing ratio of the silver compound and the formic acid or the fatty acid having 1 to 30 carbon atoms in terms of molar ratio is preferably 1:2 to 2:1 and more preferably 1:1.

(Metal Complex)

The metal complex contained in the conductive ink can be obtained, for example, by reacting a metal salt with a complexing agent. Examples of a production method of the metal complex include a method of adding a metal salt and a complexing agent to an organic solvent and stirring the mixture for a predetermined time. The stirring method is not particularly limited, and can be appropriately selected from known methods such as a stirring method using a stirrer, a stirring blade, or a mixer, and a method of applying ultrasonic waves.

Examples of the metal salt for forming the metal complex include an oxide, a thiocyanate, a sulfide, a chloride, a cyanide, a cyanate, a carbonate, an acetate, a nitrate, a nitrite, a sulfate, a phosphate, a perchlorate, a tetrafluoroborate, an acetylacetonate complex salt, or a carboxylate of a metal.

Examples of the complexing agent include an amine, an ammonium carbamate-based compound, an ammonium carbonate-based compound, an ammonium bicarbonate compound, and a carboxylic acid. Among these, from the viewpoint of conductivity and stability of the metal complex, the complexing agent preferably includes at least one selected from the group consisting of an ammonium carbamate-based compound, an ammonium carbonate-based compound, an alkylamine, and a carboxylic acid having 8 to 20 carbon atoms.

The metal complex has a structure derived from a complexing agent, and preferably has a structure derived from at least one selected from the group consisting of an ammonium carbamate-based compound, an ammonium carbonate-based compound, an amine, and a carboxylic acid having 8 to 20 carbon atoms.

Examples of the amine compound as the complexing agent include ammonia, a primary amine, a secondary amine, a tertiary amine, and a polyamine.

Examples of a primary amine having a linear alkyl group include methylamine, ethylamine, 1-propylamine, n-butylamine, n-pentylamine, n-hexylamine, heptylamine, octylamine, nonylamine, n-decylamine, undecylamine, dodecylamine, tridecylamine, tetradecylamine, pentadecylamine, hexadecylamine, heptadecylamine, and octadecylamine.

Examples of a primary amine having a branched alkyl group include isopropylamine, sec-butylamine, tert-butylamine, isopentylamine, 2-ethylhexylamine, and tert-octylamine.

Examples of a primary amine having an alicyclic structure include cyclohexylamine and dicyclohexylamine.

Examples of a primary amine having a hydroxyalkyl group include ethanolamine, diethanolamine, triethanolamine, N-methylethanolamine, propanolamine, isopropanolamine, dipropanolamine, diisopropanolamine, tripropanolamine, and triisopropanolamine.

Examples of a primary amine having an aromatic ring include benzylamine, N,N-dimethylbenzylamine, phenylamine, diphenylamine, triphenylamine, aniline, N,N-dimethylaniline, N,N-dimethyl-p-toluidine, 4-aminopyridine, and 4-dimethylaminopyridine.

Examples of the secondary amine include dimethylamine, diethylamine, dipropylamine, dibutylamine, diphenylamine, dicyclopentylamine, and methylbutylamine.

Examples of the tertiary amine include trimethylamine, triethylamine, tripropylamine, and triphenylamine.

Examples of the polyamine include ethylenediamine, 1,3-diaminopropane, diethylenetriamine, triethylenetetramine, tetramethylenepentamine, hexamethylenediamine, tetraethylenepentamine, and a combination of these amines.

The amine is preferably an alkylamine, more preferably an alkylamine having 3 to 10 carbon atoms, and still more preferably a primary alkylamine having 4 to 10 carbon atoms.

The metal complex may be configured of one amine or two or more amines.

In a case of reacting the metal salt with the amine substance, a ratio of a substance amount of the amine substance to a substance amount of the metal salt is preferably 1 to 15 times and more preferably 1.5 to 6 times. In a case in which the above ratio is within the above range, the complex formation reaction is completed, and a transparent solution is obtained.

Examples of the ammonium carbamate-based compound as the complexing agent include ammonium carbamate, methylammonium methylcarbamate, ethylammonium ethylcarbamate, 1-propylammonium 1-propylcarbamate, isopropylammonium isopropylcarbamate, butylammonium butylcarbamate, isobutylammonium isobutylcarbamate, amylammonium amylcarbamate, hexylammonium hexylcarbamate, heptylammonium heptylcarbamate, octylammonium octylcarbamate, 2-ethylhexylammonium 2-ethylhexylcarbamate, nonylammonium nonylcarbamate, and decylammonium decylcarbamate.

Examples of the ammonium carbonate-based compound as the complexing agent include ammonium carbonate, methylammonium carbonate, ethylammonium carbonate, 1-propylammonium carbonate, isopropylammonium carbonate, butylammonium carbonate, isobutylammonium carbonate, amylammonium carbonate, hexylammonium carbonate, heptylammonium carbonate, octylammonium carbonate, 2-ethylhexylammonium carbonate, nonylammonium carbonate, and decylammonium carbonate.

Examples of the ammonium bicarbonate-based compound as the complexing agent include ammonium bicarbonate, methylammonium bicarbonate, ethylammonium bicarbonate, 1-propylammonium bicarbonate, isopropylammonium bicarbonate, butylammonium bicarbonate, isobutylammonium bicarbonate, amylammonium bicarbonate, hexylammonium bicarbonate, heptylammonium bicarbonate, octylammonium bicarbonate, 2-ethylhexylammonium bicarbonate, nonylammonium bicarbonate, and decylammonium bicarbonate.

In a case where the metal salt is reacted with the ammonium carbamate-based compound, the ammonium carbonate-based compound, or the ammonium bicarbonate-based compound, a ratio of a substance amount of the ammonium carbamate-based compound, the ammonium carbonate-based compound, or the ammonium bicarbonate-based compound to a substance amount of the metal salt is preferably 0.01 to 1 time and more preferably 0.05 to 0.6 times.

Examples of the carboxylic acid as a complexing agent include caproic acid, caprylic acid, pelargonic acid, 2-ethylhexanoic acid, capric acid, neodecanoic acid, undecanoic acid, lauric acid, myristic acid, palmitic acid, stearic acid, palmitoleic acid, oleic acid, linoleic acid, and linolenic acid. Among these, the carboxylic acid is preferably a carboxylic acid having 8 to 20 carbon atoms and more preferably a carboxylic acid having 10 to 16 carbon atoms.

(Optional Component)

—Solvent—

The conductive ink preferably contains a solvent. The solvent is not particularly limited as long as it can dissolve components contained in the conductive ink, such as the metal salt and the metal complex.

From the viewpoint of ease of manufacturing, a boiling point of the solvent is preferably 30° C. to 300° C., more preferably 50° C. to 200° C., and still more preferably 50° C. to 150° C.

It is preferable that the solvent is contained in the conductive ink such that a concentration of metal ions (an amount of metal present as liberated ions with respect to 1 g of the metal salt or the metal complex) with respect to the total content of the metal salt and the metal complex is 0.01 to 3.6 mmol/g; and it is more preferable that the solvent is contained in the conductive ink such that the concentration of the metal ions with respect to the total content of the metal salt and the metal complex is 0.05 to 2 mmol/g. In a case where the concentration of the metal ions is within the above-described range, the conductive ink has excellent fluidity and exhibits excellent conductivity.

Examples of the solvent include a hydrocarbon, an alicyclic hydrocarbon, an aromatic hydrocarbon, a carbamate, an alkene, an amide, an ether, an ester, an alcohol, a thiol, a thioether, phosphine, and water. The conductive ink may contain only one solvent or two or more solvents.

The hydrocarbon is preferably a linear or branched hydrocarbon having 6 to 20 carbon atoms. Examples of the hydrocarbon include pentane, hexane, heptane, octane, nonane, decane, undecane, dodecane, tridecane, tetradecane, pentadecane, hexadecane, octadecane, nonadecane, and icosane.

The alicyclic hydrocarbon is preferably an alicyclic hydrocarbon having 6 to 20 carbon atoms. Examples of the alicyclic hydrocarbon include cyclohexane, cycloheptane, cyclooctane, cyclononane, cyclodecane, and decalin.

Examples of the aromatic hydrocarbon include benzene, toluene, xylene, and tetraline.

The ether may be any of a linear ether, a branched ether, or a cyclic ether. Examples of the ether include diethyl ether, dipropyl ether, dibutyl ether, methyl-t-butyl ether, tetrahydrofuran, tetrahydropyrane, dihydropyrane, and 1,4-dioxane.

The alcohol may be any of a primary alcohol, a secondary alcohol, or a tertiary alcohol.

Examples of the alcohol include ethanol, 1-propanol, 2-propanol, 1-methoxy-2-propanol, 1-butanol, 2-butanol, 1-pentanol, 2-pentanol, 3-pentanol, 1-hexanol, 2-hexanol, 3-hexanol, 1-octanol, 2-octanol, 3-octanol, tetrahydrofurfuryl alcohol, cyclopentanol, terpineol, decanol, isodecyl alcohol, lauryl alcohol, isolauryl alcohol, myristyl alcohol, isomyristyl alcohol, cetyl alcohol (cetanol), isocetyl alcohol, stearyl alcohol, isostearyl alcohol, oleyl alcohol, isooleyl alcohol, linoleyl alcohol, isolinoleyl alcohol, palmityl alcohol, isopalmityl alcohol, cicosyl alcohol, and isocicosyl alcohol.

Examples of the ketone include acetone, methyl ethyl ketone, methyl isobutyl ketone, and cyclohexanone.

Examples of the ester include methyl acetate, ethyl acetate, isopropyl acetate, butyl acetate, isobutyl acetate, sec-butyl acetate, methoxybutyl acetate, ethylene glycol monomethyl ether acetate, ethylene glycol monoethyl ether acetate, ethylene glycol monobutyl ether acetate, diethylene glycol monomethyl ether acetate, diethylene glycol monoethyl ether acetate, diethylene glycol monobutyl ether acetate, propylene glycol monomethyl ether acetate, propylene glycol monoethyl ether acetate, propylene glycol monobutyl ether acetate, dipropylene glycol monomethyl ether acetate, dipropylene glycol monoethyl ether acetate, dipropylene glycol monobutyl ether acetate, and 3-methoxybutyl acetate.

—Reducing Agent—

The conductive ink may contain a reducing agent. In a case where the conductive ink contains a reducing agent, reduction from the metal complex to the metal is promoted.

Examples of the reducing agent include a borohydride metal salt, an aluminum hydride salt, an amine compound, an alcohol, an organic acid, reduced sugar, a sugar alcohol, sodium sulfite, a hydrazine compound, dextrin, hydroquinone, hydroxylamine, ethylene glycol, glutathione, and an oxime compound.

The reducing agent may be the oxime compound described in JP2014-516463A. Examples of the oxime compound include acetone oxime, cyclohexanone oxime, 2-butanone oxime, 2,3-butanedione monoxime, dimethyl glyoxime, methyl acetoacetate monoxime, methyl pyruvate monoxime, benzaldehyde oxime, 1-indanone oxime, 2-adamantanone oxime, 2-methylbenzamide oxime, 3-methylbenzamide oxime, 4-methylbenzamide oxime, 3-aminobenzamide oxime, 4-aminobenzamide oxime, acetophenone oxime, benzamide oxime, and pinacolone oxime.

The conductive ink may contain one reducing agent or two or more reducing agents.

A content of the reducing agent in the conductive ink is not particularly limited, but is preferably 0.1% to 20% by mass, more preferably 0.3% to 10% by mass, and still more preferably 1% to 5% by mass with respect to the total mass of the conductive ink.

—Resin—

The conductive ink may contain a resin. In a case where the conductive ink contains a resin, adhesiveness of the conductive ink to the substrate or the like is improved.

Examples of the resin include polyester, polyethylene, polypropylene, polyacetal, polyolefin, polycarbonate, polyamide, a fluororesin, a silicone resin, ethyl cellulose, hydroxyethyl cellulose, rosin, an acrylic resin, polyvinyl chloride, polysulfone, polyvinylpyrrolidone, polyvinyl alcohol, a polyvinyl-based resin, polyacrylonitrile, polysulfide, polyamideimide, polyether, polyarylate, polyether ether ketone, polyurethane, an epoxy resin, a vinyl ester resin, a phenol resin, a melamine resin, and a urea resin.

The conductive ink may contain one resin or two or more resins.

As long as the effects of the present disclosure are not impaired, the conductive ink may further contain additives such as an inorganic salt, an organic salt, an inorganic oxide such as silica, a surface conditioner, a wetting agent, a crosslinking agent, an antioxidant, a rust inhibitor, a heat-resistant stabilizer, a surfactant, a plasticizer, a curing agent, a thickener, and a silane coupling agent. The total content of the additives in the conductive ink is preferably 20% by mass or less with respect to the total mass of the conductive ink.

(Physical Properties of Conductive Ink)

A viscosity of the conductive ink is not particularly limited, and is preferably 0.001 to 5,000 Pa·s and more preferably 0.001 to 100 Pa·s.

In a case where the coating film is formed by a spray method or an ink jet recording method, the viscosity of the conductive ink is preferably 1 to 100 mPa·s, more preferably 2 to 50 mPa·s, and still more preferably 3 to 30 mPa·s.

The viscosity of the conductive ink is a value measured at 25° C. using a viscometer. The viscosity is measured using, for example, a VISCOMETER TV-22 type viscometer (manufactured by Toki Sangyo Co., Ltd.).

A surface tension of the conductive ink is not particularly limited, and is preferably 20 to 45 mN/m and more preferably 25 to 35 mN/m.

The surface tension is a value measured at 25° C. using a surface tension meter. The surface tension is measured, for example, using DY-700 (manufactured by Kyowa Interface Science Co., Ltd.).

[Step 1]

The step 1 is a step of forming a first coating film on a substrate using a first ink, and subjecting the first coating film to at least one first curing treatment selected from the group consisting of a heating treatment and a light irradiating treatment to form a first conductive film.

As the first ink used in the step 1, the above-described conductive ink can be used.

<Substrate>

As the substrate used for forming the first coating film in the step 1, a known substrate can be used.

A material of the substrate is not particularly limited, and can be selected depending on purposes. Examples of the material of the substrate include synthetic resins such as polyimide, polyethylene terephthalate, polybutylene terephthalate, polytrimethylene terephthalate, polyethylene naphthalate, polybutylene naphthalate, polycarbonate, polyurethane, polypropylene, polyvinyl chloride, polystyrene, polyvinyl acetate, an acrylic resin, an acrylonitrile styrene resin (AS resin), an acrylonitrile-butadiene-styrene copolymer (ABS resin), triacetyl cellulose, polyamide, polyacetal, polyphenylene sulfide, polysulfone, an epoxy resin, a glass epoxy resin (impregnated resin in which an epoxy resin is impregnated into glass fiber), a melamine resin, a phenol resin, a urea resin, an alkyd resin, a fluororesin, and polylactic acid; inorganic materials such as copper, steel, aluminum, silicon, soda glass, alkali-free glass, and indium tin oxide (ITO); and papers such as base paper, art paper, coated paper, cast coated paper, resin coated paper, and synthetic paper.

The substrate may be composed of one layer or two or more layers. In a case where the substrate is composed of two or more layers, two or more substrates made of different materials may be laminated.

A form of the substrate is preferably sheet-like or film-like.

A thickness of the substrate is preferably 20 to 2,000 μm. In a case where the thickness of the substrate is 20 μm or more, a conductive film including the first conductive film and the second conductive film (hereinafter, also simply referred to as "conductive film") can be held stably, and handleability of the conductor on which the conductive film is formed is also improved.

The substrate may have an ink receiving layer. The ink receiving layer is a coating layer formed on the substrate to absorb and fix the ink.

A thickness of the ink receiving layer is preferably 1 to 20 μm. In a case where the thickness of the ink receiving layer is 1 to 20 μm, the ink receiving layer can be held more stably, homogeneity of wetting of the ink is improved, and quality of the conductive film is further improved.

The substrate may be subjected to a pretreatment before the conductive ink is applied onto the substrate. Examples of the pretreatment include known methods such as an ozone treatment, a plasma treatment, a corona treatment, a primer treatment, and a roughening treatment.

The substrate may be a substrate for a printed wiring board.

Examples of the substrate for a printed wiring board include an electronic board in which an electronic component is mounted. Examples of the electronic board include a flexible print substrate, a rigid print substrate, and a rigid flexible substrate, each of which is formed of the above-described substrate.

Examples of the electronic component include a semiconductor device, a capacitor, a transistor, and a ground line.

The above-described electronic board may be a wiring board having a wiring line on at least one of the surface of the substrate or the inside of the substrate. The wiring line is preferably a copper wiring line.

The substrate may be a substrate with an insulating film, which has an insulating film.

As a material of the insulating film, a known insulating material can be used. Examples thereof include an epoxy resin, an aramid resin, a crystalline polyolefin resin, an amorphous polyolefin resin, a fluorine-containing resin (polytetrafluoroethylene, a fully fluorinated polyimide, a fully fluorinated amorphous resin, and the like), a polyimide resin, a polyethersulfone resin, a polyphenylene sulfide resin, a polyether ether ketone resin, and an acrylate resin.

The insulating film may be a so-called optically clear pressure-sensitive adhesive sheet (OCA), or a solder resist film formed of a so-called solder resist.

In addition, the insulating film may be an insulating film formed by a step 3 described later.

<Formation of First Coating Film>

Examples of a method of forming the first coating film include a method of applying the first ink onto the substrate to form a coating film.

The first coating film may be formed to be in contact with the surface of the substrate, or may be formed to be in contact with other layers (for example, an insulating film described later) in a case where the other layers are provided on the substrate. That is, the first coating film may be directly provided on the surface of the substrate, or may be provided on the substrate through other layers.

A method of applying the first ink onto the substrate is not particularly limited, and examples thereof include known methods such as a coating method, an ink jet recording method, and an immersion method. Among these, from the viewpoint that a small amount can be applied in a droplet form to make the thickness of the conductive film thin, it is preferable to apply the first ink by an ink jet recording method.

The thickness L1 of the first coating film is, for example, 0.1 to 20 μm, preferably 0.2 to 10 μm.

The thickness L1 of the first coating film can be adjusted by an applying amount of the first ink (in a case of an ink jet recording method, an amount of droplets and a resolution).

In addition, the thickness L1 of the first coating film can be calculated from the applying amount of the first ink and the area of the first coating film to be formed.

(Ink Jet Recording Method)

The ink jet recording method may be any of an electric charge control method of ejecting ink by using an electrostatic attraction force; a drop-on-demand method (pressure pulse method) of using a vibration pressure of a piezo element; an acoustic ink jet method of converting an electric signal into an acoustic beam, irradiating ink, and ejecting the ink using a radiation pressure; or a thermal ink jet (Bubble jet (registered trademark)) method of heating ink to form air bubbles and utilizing the generated pressure.

As the ink jet recording method, particularly, it is possible to effectively use an ink jet recording method described in JP1979-059936A (JP-S54-059936A), which is a method of causing an ink to experience a rapid volume change by the action of thermal energy and jetting the ink from a nozzle by using the acting force resulting from the change of state.

Regarding the ink jet recording method, a method described in paragraphs 0093 to 0105 of JP2003-306623A can also be referred to.

Examples of ink jet heads used in the ink jet recording method include ink jet heads for a shuttle method of using short serial heads that are caused to scan a substrate in a width direction of the substrate so as to perform recording and ink jet heads for a line method of using line heads that each consist of recording elements arranged for the entire area of each side of a substrate.

In the line method, pattern formation can be performed on the entire surface of a substrate by scanning the substrate in a direction perpendicular to a direction in which the recording elements are arranged, and a transport system such as a carriage that scans a short head is unnecessary. In addition, the movement of the carriage and complex scanning control on the substrate are not necessary, and only the substrate moves. Therefore, an increase in formation speed can be realized as compared to the shuttle method.

The amount of droplets of the first ink jetted from the ink jet head is preferably 1 to 100 pL, more preferably 3 to 80 pL, and still more preferably 3 to 20 pL.

A temperature of the substrate in a case of applying the first ink onto the substrate is preferably 20° C. to 120° C. and more preferably 40° C. to 80° C. In a case where the temperature of the substrate is 20° C. to 120° C., influence of heat on the deformation of the substrate, or the like is small, and drying of the first coating film is promoted.

<First Curing Treatment>

The first curing treatment is at least one treatment selected from the group consisting of a heating treatment and a light irradiating treatment on the formed first coating film. By performing the first curing treatment on the first coating film, the metal salt or the metal complex contained in the first ink is reduced, and the first conductive film having conductivity is formed.

The first curing treatment may be only one of a heating treatment or a light irradiating treatment, or may be both a heating treatment and a light irradiating treatment. From the viewpoint that a sintering time can be shortened, it is preferable that both the heating treatment and the light irradiating treatment are performed on the first coating film.

The number of times of each of the heating treatment and the light irradiating treatment is not particularly limited. In addition, an order in a case where both the heating treatment and the light irradiating treatment are performed is not particularly limited, but from the viewpoint that surface smoothness is more excellent, it is preferable to perform the light irradiating treatment and then perform the heating treatment.

(Heating Treatment)

Conditions of the heating treatment of heating the first coating film are not particularly limited, and are appropriately adjusted according to the type of the first ink, the characteristics of the substrate, and conditions of the light irradiating treatment in a case of performing the light irradiating treatment.

A heating temperature in the heating treatment is preferably 80° C. or higher and more preferably 100° C. or higher. From the viewpoint of reducing damage to the substrate or the like, the heating temperature is preferably 250° C. or lower and more preferably 200° C. or lower.

A heating time in the heating treatment (in a case of performing the heating treatment a plurality of times, the total of heating times of the plurality of times) is preferably 1 minute or more. From the viewpoint of reducing damage to the substrate or the like, the heating time is preferably 120 minutes or less and more preferably 60 minutes or less.

In a case where the heating temperature and the heating time are within the above-described ranges, the conductive film can be formed while suppressing influence of denaturation due to heat, deformation of the substrate, and the like.

A method of the heating treatment is not particularly limited, and examples thereof include a known method using a heating unit such as a hot plate, a heating oven, and an infrared heater.

A time from the completion of the formation of the first coating film to the start of the heating treatment is preferably 60 seconds or less. In a case where the above-described time is 60 seconds or less, spread of the ink from the first coating film is suppressed, and a film with a certain thickness is likely to be formed. The lower limit value of the above-described time is not particularly limited, and the heating treatment may be started immediately after the formation of the first coating film is completed.

The completion of the formation of the first coating film is refers to, for example, a moment at which all ink droplets of the first ink have landed on the substrate or the like in a case where the first coating film is formed on the substrate by the ink jet recording method. In addition, the start of the heating treatment refers to a moment at which the temperature of the first coating film starts to rise by the heating unit.

(Light Irradiating Treatment)

Conditions of the light irradiating treatment of irradiating the first coating film with light are not particularly limited, and are appropriately adjusted according to the type of the first ink, the characteristics of the substrate, and the conditions of the heating treatment in a case of performing the heating treatment.

Examples of the light to be radiated in the light irradiating treatment include ultraviolet rays, visible light, and infrared rays; and ultraviolet rays are preferable.

A peak wavelength of the ultraviolet rays is preferably 200 to 405 nm, more preferably 250 to 400 nm, and still more preferably 250 to 400 nm.

An exposure amount in the light irradiating treatment (in a case where the light irradiating treatment is performed a plurality of times, the total exposure amount of the light irradiating treatment in the plurality of times) is preferably 0.1 to 100 J/cm$^2$ and more preferably 0.1 to 20 J/cm$^2$.

As a light source for ultraviolet irradiation, a mercury lamp, a gas laser, and a solid-state laser are mainly used, and a mercury lamp, a metal halide lamp, and an ultraviolet fluorescent lamp are widely known. In addition, a light emitting diode (UV-LED) and a laser diode (UV-LD) are expected to be used as a light source which is compact, long-life, highly efficient, and low-cost.

The light source for ultraviolet irradiation is preferably a metal halide lamp, a high-pressure mercury lamp, a medium-pressure mercury lamp, a low-pressure mercury lamp, or UV-LED.

A time from the formation of the first coating film to the start of the light irradiating treatment is preferably within 2 seconds and more preferably within 1 second. By starting the light irradiation within the above-described time, spread of the ink from the first coating film is suppressed, and a film with a certain thickness is likely to be formed. The lower limit value of the above-described time is not particularly limited, and the light irradiating treatment may be started immediately after the formation of the first coating film.

The formation of the first coating film is refers to, for example, a moment at which ink droplets of the first ink have landed on the substrate in a case where the first coating film is formed on the substrate by the ink jet recording method. In addition, the start of the light irradiating treatment refers to a moment at which the light irradiation is started. That is, in the light irradiating treatment, the light irradiating treatment may be started before all the ink droplets of the first ink land on the substrate and the formation of the first coating film is completed.

In the step 1, the treatment cycle including the formation of the first coating film and the first curing treatment described above may be carried out only once or a plurality of times. In the second and subsequent treatment cycles, the first coating film is formed on the surface of the first conductive film formed by the previous treatment cycle, and then the first coating film is subjected to the first curing treatment, whereby a laminate of the first conductive films is formed.

The number of treatment cycles in the step 1, including the formation of the first coating film and the first curing treatment, is, for example, 1 to 50, preferably 4 to 20.

A thickness of the first conductive film formed in the step 1 is preferably 50% to 98% and more preferably 80% to 98% with respect to the total thickness of the first conductive film formed in the step 1 and the second conductive film formed in the step 2. In the present specification, the "thickness of the first conductive film" means the total thickness of the first conductive film formed in all the treatment cycles of the step 1. The same applies to the meaning of "thickness" of the second conductive film and the insulating film described later.

The thickness of the first conductive film can be adjusted depending on the thickness L1 of the first coating film, and the number of treatment cycles including the formation of the first coating film and the first curing treatment.

In addition, the thickness of the first conductive film and the thickness of the conductive film described later are an arithmetic average value obtained by acquiring a cross-sectional image of the first conductive film using a scanning electron microscope, measuring lengths at 10 different positions of a portion corresponding to the thickness of the first conductive film, and arithmetically averaging the 10 lengths.

[Step 2]

The step 2 is a step of forming, using a second ink, a second coating film on the first conductive film formed in the step 1, and subjecting the second coating film to at least one second curing treatment selected from the group consisting of a heating treatment and a light irradiating treatment to form a second conductive film.

As the second ink used in the step 2, the above-described conductive ink can be used.

<Formation of Second Coating Film>

The formation of the second coating film in the step 2 is the same as the method of forming the first coating film in the step 1, including the preferred aspects thereof, except that the thickness L2 of the second coating film is adjusted such that at least one of Expression (1) or Expression (2) is satisfied; and thus the detailed description thereof will be omitted.

The thickness L2 of the second coating film formed in the step 2 is, for example, 0.2 to 5 μm, preferably 0.2 to 1.0 μm.

In addition, it is preferable that the thickness L2 of the second coating film is smaller than the thickness L1 of the first coating film.

Methods of adjusting and calculating the thickness L2 of the second coating film are the same as in the thickness L1 of the first coating film.

<Second Curing Treatment>

The second curing treatment is at least one treatment selected from the group consisting of a heating treatment and a light irradiating treatment on the formed second coating film. By performing the second curing treatment on the second coating film, the metal salt or the metal complex contained in the second ink is reduced, and the second conductive film having conductivity is formed.

In the present manufacturing method, at least one of the heating treatment or the light irradiating treatment is commonly performed in the first curing treatment and the second curing treatment such that at least one of Expression (1) or Expression (2) described above is satisfied, and each treatment condition of the first curing treatment and the second curing treatment is adjusted.

"Same" in a case of describing that the light irradiating treatment of the second curing treatment and the light irradiating treatment of the first curing treatment are the same means that a wavelength of light to be radiated to each coating film is the same.

The second curing treatment is the same as the first curing treatment including the preferred aspects thereof, except that the above-described conditions are adjusted, and thus the detailed description thereof will be omitted.

In the present manufacturing method, from the viewpoint of more excellent surface smoothness, it is preferable to perform the heating treatment as the first curing treatment and to perform the heating treatment as the second curing treatment.

In addition, in the present manufacturing method, from the viewpoint of more excellent conductivity, it is preferable to perform the light irradiating treatment as the first curing treatment and to perform the light irradiating treatment as the second curing treatment.

In the present manufacturing method, it is more preferable to perform both the heating treatment and the light irradiating treatment as the first curing treatment, and to perform both the heating treatment and the light irradiating treatment as the second curing treatment.

In the present manufacturing method, it is preferable that the numerical value calculated by {(T2-23)×t2/L2}/{(T1-23)×t1/L1} (hereinafter, also referred to as "parameter A1") in Expression (1) described is larger. This is because, in a case where the parameter A1 is large, fusing inside the conductive film proceeds, and thus the adhesiveness and the rub resistance are further improved.

From the above-described viewpoint, in a case where the heating treatment is performed as the first curing treatment and the second curing treatment in the present manufacturing method, it is preferable to satisfy Expression (1) described above, more preferable to satisfy Expression (1a), and still more preferable to satisfy Expression (1b).

$$1.5 \leq \{(T2-23)\times t2/L2\}/\{(T1-23)\times t1/L1\} \quad \text{Expression (1a)}$$

$$4 \leq \{(T2-23)\times t2/L2\}/\{(T1-23)\times t1/L1\} \quad \text{Expression (1b)}$$

In addition, from the viewpoint of preventing thermal damage to the substrate, in a case where the heating treatment is performed as the first curing treatment and the second curing treatment in the present manufacturing method, it is preferable to satisfy Expression (1c).

$$\{(T2-23)\times t2/L2\}/\{(T1-23)\times t1/L1\} \leq 10 \quad \text{Expression (1c)}$$

In the present manufacturing method, it is preferable that the numerical value calculated by (E2/L2)/(E1/L1) (hereinafter, also referred to as "parameter A2") in Expression (2) described is larger. This is because, in a case where the parameter A2 is large, fusing of the surface of the conductive film on an opposite side of the substrate and fusing inside the conductive film proceed, and thus the adhesiveness and the rub resistance are further improved.

From the above-described viewpoint, in a case where the light irradiating treatment is performed as the first curing treatment and the second curing treatment in the present manufacturing method, it is preferable to satisfy Expression (2) described above, more preferable to satisfy Expression (2a), and still more preferable to satisfy Expression (2b).

$$4 \leq (E2/L2)/(E1/L1) \quad \text{Expression (2a)}$$

$$10 \leq (E2/L2)/(E1/L1) \quad \text{Expression (2b)}$$

In addition, from the viewpoint of more excellent smoothness of the surface, in a case where the light irradiating treatment is performed as the first curing treatment and the second curing treatment in the present manufacturing method, it is preferable to satisfy Expression (2c).

$$(E2/L2)/(E1/L1) \leq 50 \quad \text{Expression (2c)}$$

From the viewpoint that the effect of the present invention is more excellent, in the present manufacturing method, it is preferable to satisfy both of Expression (1) and Expression (2) described above. More preferred aspects of the parameter A1 and the parameter A2 in a case where the present manufacturing method satisfies both of Expression (1) and Expression (2) described above are as described above.

A thickness of the second conductive film formed in the step 2 is preferably 2% to 50% and more preferably 2% to 20% with respect to the total thickness of the first conductive film formed in the step 1 and the second conductive film formed in the step 2.

The thickness of the second conductive film can be adjusted depending on the thickness L2 of the first coating film, and the number of treatment cycles including the formation of the second coating film and the second curing treatment.

The thickness of the second conductive film can be obtained, for example, by calculating a difference between the thickness of the conductive film constituted by the first conductive film and the second conductive film and the thickness of the first conductive film.

[Step 3]

The manufacturing method of a conductor may further include a step 3 of an insulating film on the substrate to produce a substrate with an insulating film, and it is preferable that the step 3 is further included.

In a case where the manufacturing method of a conductor further includes the step 3, in the step 1, the first conductive film is formed on the insulating film of the substrate with an insulating film, which is produced in the step 3. That is, the first conductive film is formed by forming, using the first ink, the first coating film on the insulating film of the substrate with an insulating film, which is produced in the step 3, and then subjecting the formed first coating film to the first curing treatment.

Examples of a method for forming the insulating film on the substrate include a method including a step of applying an insulating ink onto the substrate to form a coating film and a step of curing the formed coating film of the insulating ink.

The insulating ink used for forming the insulating film will be described later.

A method of applying the insulating ink onto the substrate is not particularly limited, and examples thereof include known methods such as a coating method, an ink jet recording method, and an immersion method. Among these, from the viewpoint that a small amount can be applied in a droplet form to make the thickness of the conductive film thin, it is preferable to apply the insulating ink by an ink jet recording method.

The method of forming the coating film by the ink jet recording method is the same as the method of forming the first coating film by the ink jet recording method in the step 1, including preferred aspects thereof, so that the detailed description thereof will be omitted.

A method of curing the coating film of the insulating ink, formed on the substrate, is not particularly limited, but it is preferable to form an insulating film by irradiating the coating film of the insulating ink with active energy rays.

An exposure amount in the irradiation with active energy rays is preferably 0.1 to 100 J/cm$^2$ and more preferably 1 to 50 J/cm$^2$. In a case where the application of the insulating ink and the irradiation with active energy rays are defined as one cycle, the exposure amount mentioned herein means the exposure amount of the active energy rays in one cycle.

In addition, from the viewpoint of suppressing occurrence of wrinkles in the insulating film, an illuminance in a case of radiating the active energy ray is preferably 8 W/cm$^2$ or more, and more preferably 10 W/cm$^2$ or more. The upper limit value of the illuminance is not particularly limited, but is, for example, 20 W/cm$^2$.

Examples of a light source for the irradiation with active energy rays include the light sources described in the description of the light irradiating treatment of the first curing treatment.

In the step 3, the treatment cycle including the step of forming the coating film using the insulating ink and the step of irradiating the coating film with active energy rays may be carried out only once or a plurality of times.

By performing the above-described treatment cycle a plurality of times, the thickness of the insulating film can be more easily adjusted. In addition, the thickness of the insulating film can also be adjusted by the amount of the insulating ink applied onto the substrate.

<Insulating Ink>

The insulating ink used for forming the insulating film will be described.

The insulating ink means an ink for forming an insulating film having electrical insulation. The electrical insulation mean a property of a volume resistivity of $10^{10}$ Ωcm or more.

The insulating ink is preferably an active energy ray curable-type ink.

Examples of the insulating ink include an ink containing a polymerizable monomer and a polymerization initiator.

(Polymerizable Monomer)

The polymerizable monomer means a monomer having at least one polymerizable group in one molecule. The polymerizable group in the polymerizable monomer may be a cationically polymerizable group or a radically polymerizable group. From the viewpoint of curing properties, a radically polymerizable group is preferable, and an ethylenically unsaturated group is more preferable.

The monomer means a compound having a molecular weight of 1,000 or less. The molecular weight can be calculated from the type and the number of atoms constituting the compound.

The polymerizable monomer may be a monofunctional polymerizable monomer having one polymerizable group or a polyfunctional polymerizable monomer having two or more polymerizable groups.

The monofunctional polymerizable monomer is not particularly limited as long as it is a monomer having one polymerizable group. As the monofunctional polymerizable monomer, from the viewpoint of curing properties, a monofunctional radically polymerizable monomer is preferable, and a monofunctional ethylenically unsaturated monomer is more preferable.

Examples of the monofunctional ethylenically unsaturated monomer include monofunctional (meth)acrylate, monofunctional (meth)acrylamide, a monofunctional aromatic vinyl compound, monofunctional vinyl ether, and a monofunctional N-vinyl compound.

Examples of the monofunctional (meth)acrylate include methyl (meth)acrylate, ethyl (meth)acrylate, propyl (meth) acrylate, n-butyl (meth)acrylate, hexyl (meth)acrylate, 2-ethylhexyl (meth)acrylate, tert-octyl (meth)acrylate, isoamyl (meth)acrylate, decyl (meth)acrylate, isodecyl (meth) acrylate, lauryl (meth)acrylate, stearyl (meth)acrylate, isostearyl (meth)acrylate, cyclohexyl (meth)acrylate, 4-n-butylcyclohexyl (meth)acrylate, 4-tert-butylcyclohexyl (meth)acrylate, bornyl (meth)acrylate, isobornyl (meth) acrylate, 2-ethylhexyldiglycol (meth)acrylate, butoxyethyl (meth)acrylate, 2-chloroethyl (meth)acrylate, 4-bromobutyl (meth)acrylate, cyanoethyl (meth)acrylate, benzyl (meth)

acrylate, butoxymethyl (meth)acrylate, 3-methoxybutyl (meth)acrylate, 2-(2-methoxyethoxy)ethyl (meth)acrylate, 2-(2-butoxyethoxy)ethyl (meth)acrylate, 2,2,2-tetrafluoroethyl (meth)acrylate, 1H, 1H,2H,2H-perfluorodecyl (meth) acrylate, 4-butylphenyl (meth)acrylate, phenyl (meth)acrylate, 2,4,5-tetramethylphenyl (meth)acrylate, 4-chlorophenyl (meth)acrylate, 2-phenoxymethyl (meth) acrylate, 2-phenoxyethyl (meth)acrylate, glycidyl (meth) acrylate, glycidyloxybutyl (meth)acrylate, glycidyloxyethyl (meth)acrylate, glycidyloxypropyl (meth)acrylate, tetrahydrofurfuryl (meth)acrylate, 2-hydroxyethyl (meth)acrylate, 3-hydroxypropyl (meth)acrylate, 2-hydroxypropyl (meth) acrylate, 2-hydroxybutyl (meth)acrylate, 3-hydroxybutyl (meth)acrylate, 4-hydroxybutyl (meth)acrylate, cyclic trimethylolpropane formal (meth)acrylate, phenylglycidyl ether (meth)acrylate, dimethylaminoethyl (meth)acrylate, diethylaminoethyl (meth)acrylate, dimethylaminopropyl (meth) acrylate, diethylaminopropyl (meth)acrylate, trimethoxysilylpropyl (meth)acrylate, trimethylsilylpropyl (meth) acrylate, polyethylene oxide monomethyl ether (meth) acrylate, polyethylene oxide (meth)acrylate, polyethylene oxide monoalkyl ether (meth)acrylate, dipropylene glycol (meth)acrylate, polypropylene oxide monoalkyl ether (meth)acrylate, 2-methacryloyloxyethyl succinate, 2-methacryloyloxyhexahydrophthalic acid, 2-methacryloyloxyethyl-2-hydroxypropyl phthalate, ethoxydiethylene glycol (meth)acrylate, butoxydiethylene glycol (meth)acrylate, trifluoroethyl (meth)acrylate, perfluorooctylethyl (meth)acrylate, 2-hydroxy-3-phenoxypropyl (meth)acrylate, ethylene oxide (EO)-modified phenol (meth)acrylate, EO-modified cresol (meth)acrylate, EO-modified nonylphenol (meth) acrylate, propylene oxide (PO)-modified nonylphenol (meth)acrylate, (meth)acrylate, EO-modified-2-ethylhexyl (meth)acrylate, dicyclopentenyl dicyclopentenyloxyethyl (meth)acrylate, dicyclopentanyl (meth)acrylate, (3-ethyl-3-oxctanylmethyl) (meth)acrylate, phenoxyethylene glycol (meth)acrylate, 2-carboxyethyl (meth)acrylate, and 2-(meth) acryloyloxyethyl succinate.

Among these, from the viewpoint of improving the heat resistance, a monofunctional (meth)acrylate having an aromatic ring or an aliphatic ring is preferable, and isobornyl (meth)acrylate, 4-tert-butylcyclohexyl (meth)acrylate, dicyclopentenyl (meth)acrylate, or dicyclopentanyl (meth)acrylate is more preferable.

Examples of the monofunctional (meth)acrylamide include (meth)acrylamide, N-methyl (meth)acrylamide, N-ethyl (meth)acrylamide, N-propyl (meth)acrylamide, N-n-butyl (meth)acrylamide, N-t-butyl (meth)acrylamide, N-butoxymethyl (meth)acrylamide, N-isopropyl (meth) acrylamide, N-methylol (meth)acrylamide, N,N-dimethyl (meth)acrylamide, N,N-diethyl (meth)acrylamide, and (meth)acryloylmorpholine.

Examples of the monofunctional aromatic vinyl compound include styrene, dimethylstyrene, trimethylstyrene, isopropylstyrene, chloromethylstyrene, methoxystyrene, acetoxystyrene, chlorostyrene, dichlorostyrene, bromostyrene, vinyl benzoic acid methyl ester, 3-methylstyrene, 4-methylstyrene, 3-ethylstyrene, 4-ethylstyrene, 3-propylstyrene, 4-propylstyrene, 3-butylstyrene, 4-butylstyrene, 3-hexylstyrene, 4-hexylstyrene, 3-octylstyrene, 4-octylstyrene, 3-(2-ethylhexyl) styrene, 4-(2-ethylhexyl) styrene, allyl styrene, isopropenyl styrene, butenyl styrene, octenyl styrene, 4-t-butoxycarbonyl styrene, and 4-t-butoxystyrene.

Examples of the monofunctional vinyl ether include methyl vinyl ether, ethyl vinyl ether, propyl vinyl ether, n-butyl vinyl ether, t-butyl vinyl ether, 2-ethylhexyl vinyl ether, n-nonyl vinyl ether, lauryl vinyl ether, cyclohexyl vinyl ether, cyclohexyl methyl vinyl ether, 4-methylcyclohexyl methyl vinyl ether, benzyl vinyl ether, dicyclopentenyl vinyl ether, 2-dicyclopentenoxyethyl vinyl ether, methoxyethyl vinyl ether, ethoxyethyl vinyl ether, butoxyethyl vinyl ether, methoxyethoxyethyl vinyl ether, ethoxyethoxyethyl vinyl ether, methoxypolyethylene glycol vinyl ether, tetrahydrofurfuryl vinyl ether, 2-hydroxyethyl vinyl ether, 2-hydroxypropyl vinyl ether, 4-hydroxybutyl vinyl ether, 4-hydroxymethylcyclohexylmethyl vinyl ether, diethylene glycol monovinyl ether, polyethylene glycol vinyl ether, chloroethyl vinyl ether, chlorobutyl vinyl ether, chloroethoxyethyl vinyl ether, phenylethyl vinyl ether, and phenoxypolyethylene glycol vinyl ether.

Examples of the monofunctional N-vinyl compound include N-vinyl-ε-caprolactam and N-vinylpyrrolidone.

The polyfunctional polymerizable monomer is not particularly limited as long as it is a monomer having two or more polymerizable groups. As the polyfunctional polymerizable monomer, from the viewpoint of curing properties, a polyfunctional radically polymerizable monomer is preferable, and a polyfunctional ethylenically unsaturated monomer is more preferable.

Examples of the polyfunctional ethylenically unsaturated monomer include a polyfunctional (meth)acrylate compound and a polyfunctional vinyl ether.

Examples of the polyfunctional (meth)acrylate include ethylene glycol di(meth)acrylate, diethylene glycol di(meth) acrylate, triethylene glycol di(meth)acrylate, polyethylene glycol di(meth)acrylate, propylene glycol di(meth)acrylate, dipropylene glycol di(meth)acrylate, tripropylene glycol di(meth)acrylate, polypropylene glycol di(meth)acrylate, butylene glycol di(meth)acrylate, tetraethylene glycol di(meth)acrylate, neopentyl glycol di(meth)acrylate, 3-methyl-1,5-pentanediol di(meth)acrylate, 1,4-hexanediol di(meth)acrylate, 1,6-hexanediol di(meth)acrylate, heptanediol di(meth)acrylate, EO-modified neopentyl glycol di(meth)acrylate, PO-modified neopentyl glycol di(meth)acrylate, EO-modified hexanediol di(meth)acrylate, PO-modified hexanediol di(meth)acrylate, octanediol di(meth)acrylate, nonanediol di(meth)acrylate, decanediol di(meth)acrylate, dodecanediol di(meth)acrylate, glycerin di(meth)acrylate, pentacrythritol di(meth)acrylate, ethylene glycol diglycidyl ether di(meth)acrylate, diethylene glycol diglycidyl ether di(meth)acrylate, tricyclodecanedimethanol di(meth)acrylate, trimethylolethane tri(meth)acrylate, tri(meth)acrylate, trimethylolpropane tri(meth)acrylate, trimethylolpropane EO-added pentacrythritol tri(meth)acrylate, pentaerythritol tetra(meth)acrylate, dipentaerythritol tetra(meth)acrylate, dipentaerythritol penta (meth)acrylate, dipentaerythritol hexa (meth)acrylate, tri(meth)acryloyloxyethoxytrimethylolpropane, glycerin polyglycidyl ether poly(meth)acrylate, and tris(2-acryloyloxyethyl) isocyanurate.

Examples of the polyfunctional vinyl ether include 1,4-butanediol divinyl ether, ethylene glycol divinyl ether, diethylene glycol divinyl ether, triethylene glycol divinyl ether, polyethylene glycol divinyl ether, propylene glycol divinyl ether, butylene glycol divinyl ether, hexanediol divinyl ether, 1,4-cyclohexanedimethanol divinyl ether, bisphenol A alkylene oxide divinyl ether, bisphenol F alkylene oxide divinyl ether, trimethylolethane trivinyl ether, trimethylolpropane trivinyl ether, ditrimethylolpropane tetravinyl ether, glycerin trivinyl ether, pentaerythritol tetravinyl ether, dipentaerythritol pentavinyl ether, dipentaerythritol hexavinyl ether, EO-added trimethylolpropane trivinyl ether, PO-added trimethylolpropane trivinyl ether, EO-added ditrimethylolpropane tetravinyl ether, PO-added ditrimethylolpropane tetravinyl ether, EO-added pentaerythritol tetravinyl ether, PO-added pentaerythritol tetravinyl ether, EO-added dipentaerythritol hexavinyl ether, and PO-added dipentaerythritol hexavinyl ether.

From the viewpoint of curing properties, the polyfunctional polymerizable monomer is preferably a monomer having 3 to 11 carbon atoms in a part other than a (meth)acryloyl group. Among the monomers having 3 to 11 carbon atoms in a part other than a (meth)acryloyl group, 1,6-hexanediol di(meth)acrylate, dipropylene glycol di(meth)acrylate, PO-modified neopentyl glycol di(meth)acrylate, 1,4-butanediol di(meth)acrylate, 3-methyl-1,5-pentanediol di(meth)acrylate, polyethylene glycol di(meth)acrylate (EO chain n=4), or 1,10-decanediol di(meth)acrylate is more preferable.

The polymerizable monomer may be used alone or in combination of two or more kinds thereof. The insulating ink preferably contains two or more kinds of polymerizable monomers.

A content of the polymerizable monomer is preferably 10% to 98% by mass and more preferably 50% to 98% by mass with respect to the total mass of the insulating ink.

(Polymerization Initiator)

Examples of the polymerization initiator contained in the insulating ink include an oxime compound, an alkylphenone compound, an acylphosphine compound, an aromatic onium salt compound, an organic peroxide, a thio compound, a hexaarylbisimidazole compound, a borate compound, an azinium compound, a titanocene compound, an active ester compound, a carbon halogen bond-containing compound, and an alkylamine.

Among these, as the polymerization initiator contained in the insulating ink, at least one selected from the group consisting of an oxime compound, an alkylphenone compound, and a titanocene compound is preferable, an alkylphenone compound is more preferable, and at least one selected from the group consisting of an α-aminoalkylphenone compound and a benzyl ketal alkylphenone is still more preferable.

A content of the polymerization initiator is preferably 0.5% to 20% by mass and more preferably 2% to 10% by mass with respect to the total mass of the insulating ink.

(Optional Component)

The insulating ink may contain a component other than the polymerization initiator and the polymerizable monomer as an optional component. Examples of the other components include a chain transfer agent, a polymerization inhibitor, a sensitizer, a surfactant, and an additive.

—Chain Transfer Agent—

The insulating ink may contain at least one chain transfer agent.

As the chain transfer agent, from the viewpoint of improving reactivity of a photopolymerization reaction, a polyfunctional thiol is preferable.

Examples of the polyfunctional thiol include an aliphatic thiol compound, an aromatic thiol compound, poly(mercaptoacetate) of a polyhydric alcohol, poly(3-mercaptopropionate) of a polyhydric alcohol, and poly(mercaptobutyrate).

—Polymerization Inhibitor—

The insulating ink may contain at least one polymerization inhibitor.

Examples of the polymerization inhibitor include p-methoxyphenol, quinones (for example, hydroquinone, benzoquinone, and methoxybenzoquinone), phenothiazine, catechols, alkylphenols (for example, dibutyl hydroxy toluene (BHT)), alkyl bisphenols, zinc dimethyldithiocarbamate, copper dimethyldithiocarbamate, copper dibutyldithiocarbamate, copper salicylate, thiodipropionic acid esters, mercaptobenzimidazole, phosphites, 2,2,6,6-tetramethylpiperidine-1-oxyl (TEMPO), 2,2,6,6-tetramethyl-4-hydroxypiperidine-1-oxyl (TEMPOL), and tris(N-nitroso-N-phenylhydroxylamine)aluminum salt (also known as Cupferron Al).

In a case where the insulating ink contains a polymerization inhibitor, a content of the polymerization inhibitor is preferably 0.01% to 2.0% by mass and more preferably 0.02% to 1.0% by mass with respect to the total mass of the insulating ink.

—Sensitizer—

The insulating ink may contain at least one sensitizer.

Examples of the sensitizer include a polynuclear aromatic compound (for example, pyrene, perylene, triphenylene, and 2-ethyl-9,10-dimethoxyanthracene), a xanthene-based compound (for example, fluorescein, eosin, erythrosin, rhodamine B, and rose bengal), a cyanine-based compound (for example, thiacarbocyanine and oxacarbocyanine), a merocyanine-based compound (for example, merocyanine and carbomerocyanine), a thiazine-based compound (for example, thionine, methylene blue, and toluidine blue), an acridine-based compound (for example, acridine orange, chloroflavine, and acryflavine), anthraquinones (for example, anthraquinone), a squarylium-based compound (for example, squarylium), a coumarin-based compound (for example, 7-diethylamino-4-methylcoumarin), a thioxanthone-based compound (for example, isopropylthioxanthone), and a thiochromanone-based compound (for example, thiochromanone). Among these, as the sensitizer, a thioxanthone-based compound is preferable.

In a case where the insulating ink contains a sensitizer, a content of the sensitizer is preferably 1.0% to 15.0% by mass and more preferably 1.5% to 5.0% by mass with respect to the total mass of the insulating ink.

—Surfactant—

The insulating ink may contain at least one surfactant.

Examples of the surfactant include surfactants described in JP1987-173463A (JP-S62-173463A) and JP1987-183457A (JP-S62-183457A). In addition, examples of the surfactant include anionic surfactants such as dialkyl sulfosuccinate, alkyl naphthalene sulfonate, and a fatty acid salt; nonionic surfactants such as polyoxyethylene alkyl ether, polyoxyethylene alkyl allyl ether, acetylene glycol, and a polyoxyethylene-polyoxypropylene block copolymer; and cationic surfactants such as an alkylamine salt and a quaternary ammonium salt. In addition, the surfactant may be a fluorine-based surfactant or a silicone-based surfactant.

In a case where the insulating ink contains a surfactant, a content of the surfactant is preferably 0.5% by mass or less, and more preferably 0.1% by mass or less with respect to the total mass of the insulating ink. The lower limit value of the content of the surfactant is not particularly limited.

—Organic Solvent—

The insulating ink may contain at least one organic solvent.

Examples of the organic solvent include (poly)alkylene glycol monoalkyl ethers, (poly)alkylene glycol dialkyl ethers, (poly)alkylene glycol acetates, (poly)alkylene glycol diacetates, (poly)alkylene glycol monoalkyl ether acetates, ketones, lactones, esters, cyclic ethers, and amides.

In a case where the insulating ink contains an organic solvent, a content of the organic solvent is preferably 70% by mass or less, and more preferably 50% by mass or less with respect to the total mass of the insulating ink. The lower limit value of the content of the organic solvent is not particularly limited.

The insulating ink may contain an additive such as a co-sensitizer, an ultraviolet absorber, an antioxidant, a fading inhibitor, and a basic compound, as necessary.

(Physical Properties of Insulating Ink)

A viscosity of the insulating ink is not particularly limited, and may be, for example, 0.001 to 5,000 Pa·s. In a case where the coating film is formed by a spray method or an ink jet recording method, the viscosity of the insulating ink is not particularly limited, but is preferably 0.5 to 100 mPa·s and more preferably 2 to 60 mPa·s.

The viscosity of the insulating ink and a measuring method of the viscosity are the same as the viscosity of the conductive ink and the measuring method of the viscosity.

A surface tension of the insulating ink is not particularly limited, but is preferably 60 mN/m or less, more preferably 20 to 50 mN/m, and still more preferably 25 to 45 mN/m.

The surface tension of the insulating ink and a measuring method of the surface tension are the same as the surface tension of the conductive ink and the measuring method of the surface tension.

Specific aspects of the manufacturing method of a conductor will be described.

The manufacturing method of a conductor may be a manufacturing method of a printed wiring board.

Examples of the manufacturing method of a printed wiring board include a method including a step of forming a conductive film on a substrate for a printed wiring board, such as an electronic board in which an electronic component is mounted, according to the methods described in the step 1 and the step 2; and a method including a step of recording an image to be a wiring pattern on a substrate using the conductive ink according to the methods described in the step 1 and the step 2.

In addition, the manufacturing method of a conductor may be a manufacturing method of an electromagnetic wave shielding body, including a step of forming a conductive film on a substrate according to the methods described in the step 1 and the step 2.

The substrate used in the manufacturing method of an electromagnetic wave shielding body may be the above-described electronic board in which an electronic component is mounted. In other words, the manufacturing method of a conductor may be a manufacturing method of a printed wiring board with an electromagnetic wave shield, the manufacturing method including a step of forming a conductive film on an electronic board in which an electronic component is mounted, according to the methods described in the step 1 and the step 2.

In a case where the conductive film is formed on the electronic board in which an electronic component is mounted, it is preferable to form the conductive film so as to cover the electronic component from the viewpoint that electromagnetic wave-shielding properties are more excellent. In addition, it is preferable that the conductive film is electrically connected to a ground electrode.

In the manufacturing method of a printed wiring board or in the manufacturing method of an electromagnetic wave shielding body described above, it is preferable that, before the step 1, an insulating film is formed on the substrate according to the method described in the step 3, and then a conductive film covering the insulating film is formed according to the methods described in the step 1 and the step 2.

By providing the insulating film formed of the insulating ink between the substrate and the conductive film by the above-described method, it is possible to produce a printed wiring board or an electromagnetic wave shielding body, in which adhesiveness of the conductive film is further improved. In addition, by the above-described method, it is possible to produce an electromagnetic wave shielding body having more excellent electromagnetic wave-shielding properties.

In a case where the insulating film and the conductive film are arranged on the electronic board in which an electronic component is mounted, it is preferable that the insulating film is disposed to cover all electronic components except for the ground electrode, from the viewpoint that the electromagnetic wave-shielding properties are more excellent.

[Conductor]

The conductor manufactured by the present manufacturing method (hereinafter, also simply referred to as "conductor") includes at least a substrate and a conductive film composed of a first conductive film and a second conductive film.

The conductor may include a member other than the substrate and the conductive film. Examples of the member other than the conductive film and the substrate include an insulating film and an electronic component (a semiconductor device, a ground line, and the like) mounted in the substrate.

Since the substrate included in the conductor is the substrate used in the step 1, the detailed description thereof will be omitted.

[Conductive Film]

The conductive film included in the conductor is composed of a first conductive film and a second conductive film, and contains a metal constituting a metal salt or a metal complex, contained in the first ink and the second ink.

Since the above-described metal is the same as the metal constituting the metal salt or the metal complex contained in the conductive ink, the detailed description thereof will be omitted.

The metal contained in the conductive film varies depending on compositions of the first ink and the second ink used in the present manufacturing method, and may be only one kind or two or more kinds.

A content of the metal contained in the conductive film is preferably 5% to 70% by mass and more preferably 7% to 50% by mass with respect to the total mass of the conductive film.

A thickness of the conductive film is not particularly limited, but from the viewpoint of excellent productivity and conductivity, it is preferably 0.1 to 100 μm and more preferably 1 to 50 μm.

The thickness of the conductive film can be adjusted by adjusting each of the thickness of the first conductive film and the thickness of the second conductive film by the above-described method.

[Insulating Film]

It is preferable that the conductor includes an insulating film.

Among these, in a case where the conductor is used as an electromagnetic wave shielding body, the conductor preferably includes the substrate, the insulating film, and the conductive film in this order.

The insulating film is a film having electrical insulation, and has a function of electrically insulating members arranged to sandwich the insulating film.

Examples of the insulating film include the insulating film included in the above-described substrate with an insulating film, and the insulating film formed of the insulating ink by the above-described method of the step 3.

A thickness of the insulating film is preferably 30 to 3,000 μm. In a case where the thickness of the insulating film is within the above-described range, the conductive film is more easily formed, and insulating properties of the insulating film are further improved.

The thickness of the insulating film can be measured according to the above-described measuring method of the conductive film.

[Applications of Conductor]

The conductor obtained as described above can be applied to various applications.

Examples of the application of the conductor include an electromagnetic wave shielding body. By shielding electromagnetic waves such as radio waves and microwaves (ultra high frequency) generated by electronic apparatuses, the electromagnetic wave shielding body can suppress both the influence of the interference due to external electromagnetic wave and the influence of the electromagnetic wave radiated from the semiconductor device on other semiconductor devices, electronic devices, or the like. In addition, the electromagnetic wave shielding body can prevent generation of static electricity.

In a case where the conductor is used as an electromagnetic wave shielding body, the conductive film is often electrically connected to a ground line provided on the substrate or the like. Since at least a part of the conductive film is electrically connected to the ground line, a current generated by the incidence of the electromagnetic wave on the conductive film flows to the ground line, and the electromagnetic wave is attenuated. Since the current generated in the conductive film is likely to flow into the ground line and the attenuation of the electromagnetic wave is likely to occur, it is preferable that a large number of regions in which the conductive film and the ground line are electrically connected are present.

Such an electromagnetic wave shielding body can be used for electronic apparatuses such as a personal computer, a workstation, a video imaging device, and an electronic medical device.

EXAMPLES

Hereinafter, the present invention will be described in detail using examples. The materials, the amounts of materials to be used, the proportions, the treatment details, and the treatment procedure shown in the examples below may be modified appropriately as long as the modifications do not depart from the spirit of the present invention. Therefore, the present invention is not limited to the aspects shown in Examples. Unless specified otherwise, "part(s)" and "%" represent "part(s) by mass" and "mass %".

Example 1

<Ink Preparation Step>

6.08 g of isobutylammonium carbonate and 15.0 g of isopropyl alcohol were charged into a three-neck flask having a capacity of 50 mL, and the mixed solution was stirred to prepare a solution. Next, 2.0 g of silver oxide was added to the prepared solution, and the mixture was allowed to react at 23° C. for 2 hours to obtain a uniform solution. 0.3 g of 2-hydroxy-2-methylpropylamine was further added to the obtained solution, and the mixture was stirred to obtain a solution containing a silver complex. The solution was filtered using a membrane filter made of polytetrafluoroethylene (PTFE) having a pore diameter of 0.45 μm to obtain a conductive ink 1 containing a silver complex.

The obtained conductive ink 1 was used as the first ink in the step 1 and as the second ink in the step 2.

<Step 1>

An ink cartridge (10 picoliters) of an ink jet recording device (product name "DMP-2850", manufactured by FUJIFILM Dimatix, Inc.) was filled with the above-described conductive ink 1 as a first ink. A UV spot curing device ("OmniCure S2000", manufactured by Lumen Dynamics Group Inc., wavelength: 385 nm) was attached to a side of a head of the above-described ink jet recording device at a position 7 cm away from a nozzle position of an ink jet.

As image recording conditions of the ink jet recording device, a resolution was set to 1,200 dots per inch (dpi), a droplet amount was set to 10 picoliters per dot, a jetting frequency was set to 4 kHz, and a head temperature during jetting was set to 30° C.

A substrate (a glass epoxy substrate having an insulating film consisting of a solder resist and formed on a surface) was fixed to a stage of the ink jet recording device, and a printing origin was aligned with an upper left corner of a frame-shaped ground electrode in a case where the substrate was viewed from above. Next, the conductive ink 1 was jetted onto a surface of the solder resist film under the image recording conditions described above to form a first coating film consisting of a solid image having a width of 2 cm and a length of 2 cm. In this case, immediately after the conductive ink 1 was jetted (within 2 seconds from the landing of the conductive ink 1), the first coating film was irradiated with UV light (exposure amount: 6 J/cm$^2$) using the above-described UV spot curing device. In addition, a thickness of the formed first coating film was 20 μm. Next, after the first coating film was formed, the substrate was heated using a hot plate at 160° C. for 20 minutes to obtain a single film of the first conductive film. The substrate was heated 60 seconds after the formation of the first coating film was completed. A series of the operations including the formation of the first coating film, and the first curing treatment including the light irradiating treatment and the heating treatment were regarded as one cycle, and the series of the operations were repeated 10 times to form a laminate including 10 layers of the first conductive films.

<Step 2>

The ink cartridge of the same ink jet recording device was filled with the same conductive ink 1 as in the step 1 as a second ink.

A second coating film consisting of a solid image having a width of 2 cm and a length of 2 cm was formed on the first conductive film formed in the step 1 according to the method described in the step 1, except that the heating temperature of the substrate in the heating treatment was changed to 180° C.; and then a single film of the second conductive film was formed by performing a second curing treatment including the light irradiating treatment and the heating treatment. A series of the operations including the formation of the second coating film, and the second curing treatment including the light irradiating treatment and the heating treatment were regarded as one cycle, and the series of the operations were repeated 4 times to form a laminate including 4 layers of the second conductive films, thereby obtaining a conductor of Example 1.

The thickness of the conductive film included in the produced conductor of Example 1 (total of the thickness of the first conductive film and the thickness of the second conductive film) was 5.8 μm.

Examples 2 to 12 and 14 to 22, and Comparative Examples 1 to 4

The first conductive film and the second conductive film were formed according to the method described in Example 1, except that, in at least one of the step 1 or the step 2, at least one of the image recording conditions (resolution), the heating temperature and heating time of the heating treatment, the exposure amount in the light irradiating treatment, or the number of cycles was changed to the conditions shown in Tables 1 to 3 below, thereby producing each conductor.

In Examples 3, 4, 7, 9 to 12, 15 to 18, and 20 to 22, and Comparative Example 3, in addition to the UV irradiation treatment (exposure amount: 6 $J/cm^2$) performed immediately after the jetting of the conductive ink 1 as the light irradiating treatment in the second curing treatment included in the step 2, a post exposure was performed by irradiating the solid image which had been subjected to the heating treatment using a hot plate with UV at an exposure amount described in Tables 1 to 3 using a UV-LED lamp (manufactured by KYOCERA Corporation, wavelength: 385 nm), thereby forming a single film of a conductive film.

Example 13 and Comparative Example 5

<Step 3 (Formation of Insulating Film Using Insulating Ink)>

The following components were charged into a resin beaker having a capacity of 300 mL, and the obtained mixture was stirred at 25° C. for 20 minutes under the condition of 5,000 rpm using a mixer (product name "L4R" manufactured by Silverson), thereby obtaining an insulating ink 1.

Isobornyl acrylate (manufactured by FUJIFILM Wako Pure Chemical Corporation): 34.0 g N-Vinylcaprolactam: 22.0 g 1,6-Hexanediol diacrylate: 30.0 g Trimethylolpropane triacrylate (manufactured by FUJIFILM Wako Pure Chemical Corporation): 8.0 g Polymerization initiator (2-(dimethylamino)-2-(4-methylbenzyl)-1-(4-morpholinophenyl)-butan-1-one, product name "Omnirad (registered trademark) 379", manufactured by IGM Resins B.V.): 4.0 g Sensitizer (2-isopropylthioxanthone, product name "SPEEDCURE (registered trademark) ITX", manufactured by Lambson): 2.0 g An ink cartridge (10 picoliters) of an ink jet recording device (trade name "DMP-2850" manufactured by FUJIFILM Dimatix, Inc.) was filled with the insulating ink 1. The UV spot curing device was attached to the ink jet recording device as described above.

As image recording conditions of the ink jet recording device, a resolution was set to 1,200 dpi, a droplet amount was set to 10 picoliters per dot, a jetting frequency was set to 16 kHz, and a head temperature during jetting was set to 45° C.

A substrate (a glass epoxy substrate in which a solder resist film was formed on a surface) was fixed to a stage of the ink jet recording device, and a printing origin was aligned with an upper left corner of a frame-shaped ground electrode. Next, the insulating ink 1 was jetted onto a surface of the solder resist film under the image recording conditions described above to form a solid image having a width of 3 cm and a length of 3 cm, and the formed solid image was irradiated with UV light (exposure amount: 4 $J/cm^2$) using the above-described UV spot curing device to form an insulating film 2. A thickness of the formed insulating film 2 was 21 μm.

<Production of Conductor>

Conductors of Example 13 and Comparative Example 5 were each produced according to the method described in Example 9 and Comparative Example 1, except that the first conductive film and the second conductive film were formed on the formed insulating film 2.

[Evaluation]

<Rub Resistance>

The conductive film of each manufactured conductor was rubbed 20 times with a white cotton swab. Thereafter, a change in appearance in the rubbed region of the conductive film (rubbed region) and adhesion of the conductive film to the cotton swab were observed, and rub resistance was evaluated based on the observation results according to the following standard.

(Evaluation Standard for Rub Resistance)

5: no change in appearance of the rubbed region was observed, and no adhesion of the conductive film to the cotton swab was observed.

4: there was no change in the appearance of the rubbed region, but slight black or silver attachment was observed on the cotton swab.

3: slight rubbing traces were observed in the rubbed region and black or silver attachment was observed on the cotton swab, but exposure of the lower layer (insulating film) was not observed.

2: clear rubbing traces were observed in the rubbed region, and an area ratio of the region where the lower layer was exposed in the rubbed region was less than 10%.

1: clear rubbing traces were observed in the rubbed region, and an area ratio of the region where the lower layer was exposed in the rubbed region was 10% or more.

<Adhesiveness>

A crosshatch test was carried out on the conductive film of each manufactured conductor by the following method. Six notches were made in each of directions orthogonal to each other on the surface of the conductive film. A piece of cellophane tape ("CELLOTAPE (registered trademark) CT-18", manufactured by NICHIBAN Co., Ltd.) was attached to the conductive film having the notches formed thereon, and then the piece of tape was peeled off from the conductive film. The peeling of the conductive film on the surface from which the piece of tape was peeled off (exposure of the lower layer) and the amount of the conductive film adhering to the peeled piece of tape were observed, and adhesiveness was evaluated based on the observation results according to the following standard.

(Evaluation Standard for Adhesiveness)

5: peeling was not observed on the surface of the conductive film, and no black or silver attachment was observed on the piece of tape.

4: peeling of the conductive film was observed only at the intersection of the notches on the surface of the conductive film, and/or black or silver attachment was slightly observed on the piece of tape.

3: peeling of the conductive film was observed only at the intersection of the notches on the surface of the conductive film, and in the piece of tape, black or silver attachment was observed to adhere to an area of less than 10% of the area of the portion where the notches were made in a crosshatch manner.

2: on the surface of the conductive film, peeling of the conductive film was observed in less than 10% of the area of the cross-hatched portion, and/or in the piece of tape, black or silver attachment was observed to adhere to an area of 10% or more and less than 50% of the area of the portion where the notches were made in a crosshatch manner.

1: on the surface of the conductive film, peeling of the conductive film was observed in 10% or more of the area of the cross-hatched portion, and/or in the piece of tape, black or silver attachment was observed to adhere to an area of 50% or more of the area of the portion where the notches were made in a crosshatch manner.

Tables 1 to 3 show the manufacturing conditions and evaluation results of the respective manufacturing methods.

In the tables, "Substrate 1" in the column of "Substrate" indicates that the first conductive film was formed on the surface of the solder resist film of the substrate with a solder resist film; and "Substrate 2" indicates that the first conductive film was formed on the surface of the insulating film formed of the insulating ink 1.

In the tables, each column in "Step 1" and "Step 2" indicates the treatment conditions of the step 1 and the step 2, respectively.

The numerical value in the column of "Resolution (dpi)" indicates a resolution in a case where the first coating film or the second coating film was formed by an ink jet recording method.

The numerical values in the columns of "Film thickness L1 (μm)" and "Film thickness L2 (μm)" indicate the thickness of each of the first coating film and the second coating film.

The numerical values in the columns of "Exposure amount Ela (J/cm$^2$)" and "Exposure amount E2a (J/cm$^2$)" indicate the exposure amounts of UV light in each step immediately after the conductive ink was jetted.

The numerical values in the columns of "Heating temperature T1 (C)" and "Heating temperature T2 (° C.)" indicate the heating temperatures in the heating treatment for each of the first coating film and the second coating film.

The numerical values in the columns of "Heating time t1 (min)" and "Heating time t2 (min)" indicate the heating time in the heating treatment for each of the first coating film and the second coating film.

The numerical value in the column of "Exposure amount E2b (J/cm$^2$)" indicates the exposure amount of UV light after the heating treatment of the second coating film.

The numerical values in the column of "Exposure amount E1 (J/cm$^2$)" and "Exposure amount E2 (J/cm$^2$)" indicate the total exposure amount of UV light radiated to each of the first coating film and the second coating film.

The numerical value in the column of "Number of cycles" indicates the number of a series of treatment cycles including the formation of the coating film and the curing treatment, which were carried out in each step.

The column of "Expression (1)" of "Conductor" indicates the numerical value of the parameter A1 calculated by Expression (1); and the column of "Expression (2)" indicates the numerical value of the parameter A2 calculated by Expression (2). In a case where the numerical value in the column of "Expression (1)" is 1.2 or more, it indicates that Expression (1) was satisfied, and in a case where the numerical value in the column of "Expression (2)" is 2.0 or more, it indicates that Expression (2) was satisfied.

TABLE 1

| | | Example | | | | |
|---|---|---|---|---|---|---|
| | | 1 | 2 | 3 | 4 | 5 |
| | Substrate | Substrate 1 | Substrate 1 | Substrate 1 | Substrate 1 | Substrate 1 |
| Step 1 | Resolution (dpi) | 1200 | 1200 | 1200 | 1200 | 1200 |
| | Film thickness L1 (μm) | 20 | 20 | 20 | 20 | 20 |
| | Exposure amount E1a (J/cm$^2$) | 6 | 6 | 6 | 6 | 6 |
| | Heating temperature T1 (° C.) | 160 | 160 | 160 | 160 | 160 |
| | Heating time t1 (min) | 20 | 20 | 20 | 20 | 20 |
| | Exposure amount E1 (J/cm$^2$) | 6 | 6 | 6 | 6 | 6 |
| | Number of cycles | 10 | 10 | 10 | 10 | 10 |
| Step 2 | Resolution (dpi) | 1200 | 1200 | 1200 | 1200 | 850 |
| | Film thickness L2 (μm) | 20 | 20 | 20 | 20 | 10 |
| | Exposure amount E2a (J/cm$^2$) | 6 | 6 | 6 | 6 | 6 |
| | Heating temperature T2 (° C.) | 190 | 230 | 160 | 160 | 160 |
| | Heating time t2 (min) | 20 | 20 | 20 | 20 | 10 |
| | Exposure amount E2b (J/cm$^2$) | 0 | 0 | 24 | 36 | 0 |
| | Exposure amount E2 (J/cm$^2$) | 6 | 6 | 30 | 42 | 6 |
| | Number of cycles | 4 | 4 | 4 | 4 | 4 |
| Conductor | Expression (1) | 1.22 | 1.51 | 1.00 | 1.00 | 1.00 |
| | Expression (2) | 1.00 | 1.00 | 5.00 | 7.00 | 2.00 |
| Evaluation | Adhesiveness | 3 | 3 | 3 | 4 | 3 |
| | Rub resistance | 3 | 4 | 4 | 5 | 3 |

| | | Example | | | | |
|---|---|---|---|---|---|---|
| | | 6 | 7 | 8 | 9 | 10 |
| | Substrate | Substrate 1 | Substrate 1 | Substrate 1 | Substrate 1 | Substrate 1 |
| Step 1 | Resolution (dpi) | 1200 | 1200 | 1200 | 1200 | 1200 |
| | Film thickness L1 (μm) | 20 | 20 | 20 | 20 | 20 |
| | Exposure amount E1a (J/cm$^2$) | 6 | 6 | 6 | 6 | 6 |
| | Heating temperature T1 (° C.) | 160 | 160 | 160 | 160 | 160 |
| | Heating time t1 (min) | 20 | 20 | 20 | 20 | 20 |
| | Exposure amount E1 (J/cm$^2$) | 6 | 6 | 6 | 6 | 6 |
| | Number of cycles | 10 | 10 | 10 | 10 | 10 |
| Step 2 | Resolution (dpi) | 600 | 1200 | 600 | 600 | 600 |
| | Film thickness L2 (μm) | 5 | 20 | 5 | 5 | 5 |
| | Exposure amount E2a (J/cm$^2$) | 6 | 6 | 6 | 6 | 6 |
| | Heating temperature T2 (° C.) | 160 | 190 | 190 | 160 | 190 |

TABLE 1-continued

| | | | | | | |
|---|---|---|---|---|---|---|
| | Heating time t2 (min) | 20 | 20 | 20 | 20 | 20 |
| | Exposure amount E2b (J/cm$^2$) | 0 | 24 | 0 | 24 | 24 |
| | Exposure amount E2 (J/cm$^2$) | 6 | 30 | 6 | 30 | 30 |
| | Number of cycles | 4 | 4 | 4 | 4 | 4 |
| Conductor | Expression (1) | 4.00 | 1.22 | 4.88 | 4.00 | 4.88 |
| | Expression (2) | 4.00 | 5.00 | 4.00 | 20.00 | 20.00 |
| Evaluation | Adhesiveness | 3 | 3 | 4 | 4 | 5 |
| | Rub resistance | 4 | 4 | 4 | 5 | 5 |

TABLE 2

| | | Example | | | | |
|---|---|---|---|---|---|---|
| | | 11 | 12 | 13 | 14 | 15 |
| | Substrate | Substrate 1 | Substrate 1 | Substrate 2 | Substrate 1 | Substrate 1 |
| Step 1 | Resolution (dpi) | 1200 | 1200 | 1200 | 1690 | 1200 |
| | Film thickness L1 (μm) | 20 | 20 | 20 | 40 | 20 |
| | Exposure amount E1a (J/cm$^2$) | 6 | 6 | 6 | 6 | 6 |
| | Heating temperature T1 (° C.) | 180 | 140 | 160 | 160 | 160 |
| | Heating time t1 (min) | 20 | 20 | 20 | 20 | 10 |
| | Exposure amount E1 (J/cm$^2$) | 6 | 6 | 6 | 6 | 6 |
| | Number of cycles | 10 | 10 | 10 | 5 | 10 |
| Step 2 | Resolution (dpi) | 600 | 600 | 600 | 1200 | 1200 |
| | Film thickness L2 (μm) | 5 | 5 | 5 | 20 | 20 |
| | Exposure amount E2a (J/cm$^2$) | 6 | 6 | 6 | 6 | 6 |
| | Heating temperature T2 (° C.) | 190 | 140 | 160 | 200 | 190 |
| | Heating time t2 (min) | 20 | 20 | 20 | 20 | 20 |
| | Exposure amount E2b (J/cm$^2$) | 24 | 30 | 24 | 0 | 36 |
| | Exposure amount E2 (J/cm$^2$) | 30 | 36 | 30 | 6 | 42 |
| | Number of cycles | 4 | 4 | 4 | 4 | 4 |
| Conductor | Expression (1) | 4.25 | 4.00 | 4.00 | 2.58 | 2.44 |
| | Expression (2) | 20.00 | 24.00 | 20.00 | 2.00 | 7.00 |
| Evaluation | Adhesiveness | 5 | 5 | 5 | 3 | 5 |
| | Rub resistance | 5 | 5 | 5 | 4 | 4 |

| | | Example | | | | |
|---|---|---|---|---|---|---|
| | | 16 | 17 | 18 | 19 | 20 |
| | Substrate | Substrate 1 | Substrate 1 | Substrate 1 | Substrate 1 | Substrate 1 |
| Step 1 | Resolution (dpi) | 1200 | 1200 | 1200 | 1200 | 1200 |
| | Film thickness L1 (μm) | 20 | 20 | 20 | 20 | 20 |
| | Exposure amount E1a (J/cm$^2$) | 6 | 6 | 6 | 6 | 6 |
| | Heating temperature T1 (° C.) | 160 | 160 | 160 | 160 | 160 |
| | Heating time t1 (min) | 20 | 20 | 20 | 20 | 20 |
| | Exposure amount E1 (J/cm$^2$) | 3 | 6 | 6 | 6 | 6 |
| | Number of cycles | 10 | 10 | 10 | 10 | 10 |
| Step 2 | Resolution (dpi) | 1200 | 1200 | 1200 | 850 | 1200 |
| | Film thickness L2 (μm) | 20 | 20 | 20 | 10 | 20 |
| | Exposure amount E2a (J/cm$^2$) | 6 | 6 | 6 | 3 | 6 |
| | Heating temperature T2 (° C.) | 190 | 190 | 190 | 230 | 160 |
| | Heating time t2 (min) | 20 | 20 | 30 | 30 | 20 |
| | Exposure amount E2b (J/cm$^2$) | 36 | 36 | 36 | 0 | 8 |
| | Exposure amount E2 (J/cm$^2$) | 42 | 42 | 42 | 3 | 14 |
| | Number of cycles | 4 | 8 | 4 | 4 | 4 |
| Conductor | Expression (1) | 1.22 | 1.22 | 1.83 | 4.53 | 1.00 |
| | Expression (2) | 14.00 | 7.00 | 7.00 | 1.00 | 2.33 |
| Evaluation | Adhesiveness | 4 | 5 | 5 | 4 | 3 |
| | Rub resistance | 5 | 4 | 5 | 4 | 3 |

TABLE 3

| | | Example | | Comparative Example | |
|---|---|---|---|---|---|
| | | 21 | 22 | 1 | 2 |
| | Substrate | Substrate 1 | Substrate 1 | Substrate 1 | Substrate 1 |
| Step 1 | Resolution (dpi) | 1200 | 1200 | 1200 | 1200 |
| | Film thickness L1 (μm) | 20 | 20 | 20 | 20 |
| | Exposure amount E1a (J/cm$^2$) | 6 | 6 | 6 | 6 |

TABLE 3-continued

| | | | | | |
|---|---|---|---|---|---|
| | Heating temperature T1 (° C.) | 160 | 160 | 160 | 160 |
| | Heating time t1 (min) | 20 | 20 | 20 | 20 |
| | Exposure amount E1 (J/cm$^2$) | 6 | 6 | 6 | 6 |
| | Number of cycles | 10 | 10 | 10 | 10 |
| Step 2 | Resolution (dpi) | 1200 | 850 | 1200 | 1200 |
| | Film thickness L2 (μm) | 20 | 10 | 20 | 20 |
| | Exposure amount E2a (J/cm$^2$) | 6 | 6 | 6 | 10 |
| | Heating temperature T2 (° C.) | 230 | 230 | 160 | 160 |
| | Heating time t2 (min) | 20 | 30 | 20 | 20 |
| | Exposure amount E2b (J/cm$^2$) | 8 | 15 | 0 | 0 |
| | Exposure amount E2 (J/cm$^2$) | 14 | 21 | 6 | 10 |
| | Number of cycles | 4 | 4 | 4 | 4 |
| Conductor | Expression (1) | 1.51 | 4.53 | 1.00 | 1.00 |
| | Expression (2) | 2.33 | 7.00 | 1.00 | 1.67 |
| Evaluation | Adhesiveness | 4 | 5 | 1 | 2 |
| | Rub resistance | 4 | 5 | 1 | 1 |

| | | Comparative Example | | |
|---|---|---|---|---|
| | | 3 | 4 | 5 |
| | Substrate | Substrate 1 | Substrate 1 | Substrate 2 |
| Step 1 | Resolution (dpi) | 1200 | 1200 | 1200 |
| | Film thickness L1 (μm) | 20 | 20 | 20 |
| | Exposure amount E1a (J/cm$^2$) | 6 | 6 | 6 |
| | Heating temperature T1 (° C.) | 160 | 160 | 160 |
| | Heating time t1 (min) | 20 | 20 | 20 |
| | Exposure amount E1 (J/cm$^2$) | 6 | 6 | 6 |
| | Number of cycles | 10 | 10 | 10 |
| Step 2 | Resolution (dpi) | 1200 | 1690 | 1200 |
| | Film thickness L2 (μm) | 20 | 40 | 20 |
| | Exposure amount E2a (J/cm$^2$) | 6 | 6 | 6 |
| | Heating temperature T2 (° C.) | 160 | 160 | 160 |
| | Heating time t2 (min) | 20 | 20 | 20 |
| | Exposure amount E2b (J/cm$^2$) | 5 | 0 | 0 |
| | Exposure amount E2 (J/cm$^2$) | 11 | 6 | 6 |
| | Number of cycles | 4 | 4 | 4 |
| Conductor | Expression (1) | 1.00 | 0.50 | 1.00 |
| | Expression (2) | 1.83 | 0.50 | 1.00 |
| Evaluation | Adhesiveness | 2 | 1 | 2 |
| | Rub resistance | 1 | 1 | 1 |

From the results shown in the above tables, it was found that, in the manufacturing method according to the embodiment of the present invention, at least one of the adhesiveness or the rub resistance was more excellent as compared with the methods of Comparative Examples 1 to 5, in which any of Expression (1) and Expression (2) was not satisfied.

In a case where the parameter A1 calculated by Expression (1) was larger, it was found that the adhesiveness and the rub resistance were more excellent (for example, comparison of Examples 1, 2, and 19).

In addition, in a case where the parameter A2 calculated by Expression (2) was larger, it was found that the adhesiveness and the rub resistance were more excellent (for example, comparison of Examples 20, 3, and 4).

In addition, in a case where both Expression (1) and Expression (2) were satisfied in the manufacturing method of a conductor, it was found that at least one of the adhesiveness or the rub resistance was more excellent than as compared with a case where only one of Expression (1) or Expression (2) was satisfied (for example, comparison of Examples 1, 2, 4, 21, and 22).

What is claimed is:

1. A manufacturing method of a conductor, comprising:

an ink preparation step of preparing a first ink containing at least a metal salt or a metal complex and a second ink containing at least a metal salt or a metal complex;

a step 1 of forming a first coating film on a substrate using the first ink, and subjecting the first coating film to at least one first curing treatment selected from the group consisting of a heating treatment to form a first conductive film; and a step 2 of forming a second coating film on the first conductive film using the second ink, and subjecting the second coating film to at least one second curing treatment selected from the group consisting of a heating treatment to form a second conductive film, wherein a thickness of the second coating film formed in the step 2 is smaller than a thickness of the first coating film formed in the step 1, and Expression (1) is satisfied, $$1.2 \leq \{(T2\ 23) \times t2/L2\}/\{(T1 - 23) \times t1/L1\} \quad \text{Expression (1)}$$

in the expressions, L1 and L2 each represent a thickness (μm) of the first coating film or the second coating film, T1 and T2 each represent a heating temperature (° C.) of the heating treatment to be performed as the first curing treatment or the second curing treatment, t1 and t2 each represent a heating time (min) of the heating treatment to be performed as the first curing treatment performed as the first curing treatment or the second curing treatment.

2. The manufacturing method of a conductor according to claim 1, wherein the heating treatment is performed as the first curing treatment in the step 1, and the heating treatment is performed as the second curing treatment in the step 2.

3. The manufacturing method of a conductor according to claim 1, further comprising:

a step 3 of forming an insulating film on the substrate to produce a substrate with an insulating film, wherein the step 1 is a step of forming the first conductive film on the insulating film of the substrate with an insulating film, which is produced in the step 3.

4. A manufacturing method of an electromagnetic wave shielding body, comprising:

a step of forming a conductive film on a substrate according to the manufacturing method of a conductor according to claim 1.

5. The manufacturing method of an electromagnetic wave shielding body according to claim 4, wherein the substrate is an electronic board in which an electronic component is mounted.

6. The manufacturing method of a conductor according to claim 1, wherein the first ink and the second ink are the same as each other.

7. The manufacturing method of a conductor according to claim 6, wherein the heating treatment is performed as the first curing treatment in the step 1, and the heating treatment is performed as the second curing treatment in the step 2.

8. The manufacturing method of a conductor according to claim 6, further comprising:

a step 3 of forming an insulating film on the substrate to produce a substrate with an insulating film, wherein the step 1 is a step of forming the first conductive film on the insulating film of the substrate with an insulating film, which is produced in the step 3.

9. A manufacturing method of an electromagnetic wave shielding body, comprising:

a step of forming a conductive film on a substrate according to the manufacturing method of a conductor according to claim 2.

10. The manufacturing method of an electromagnetic wave shielding body according to claim 9, wherein the substrate is an electronic board in which an electronic component is mounted.

* * * * *